(12) United States Patent
Kasai

(10) Patent No.: US 10,761,115 B2
(45) Date of Patent: Sep. 1, 2020

(54) SENSOR AND MEASURING APPARATUS

(71) Applicant: HIOKI DENKI KABUSHIKI KAISHA, Nagano (JP)

(72) Inventor: Shin Kasai, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 67 days.

(21) Appl. No.: 16/227,871

(22) Filed: Dec. 20, 2018

(65) Prior Publication Data

US 2019/0195919 A1 Jun. 27, 2019

(30) Foreign Application Priority Data

Dec. 25, 2017 (JP) ................. 2017-247539

(51) Int. Cl.
*G01R 15/16* (2006.01)
*G01R 19/00* (2006.01)
*G01R 1/04* (2006.01)

(52) U.S. Cl.
CPC ........... *G01R 15/16* (2013.01); *G01R 1/0416* (2013.01); *G01R 19/0084* (2013.01)

(58) Field of Classification Search
CPC ... G01R 15/16; G01R 1/0416; G01R 19/0084
USPC ........................................... 324/126
See application file for complete search history.

(56) References Cited

U.S. PATENT DOCUMENTS

| 2005/0145013 A1* | 7/2005 | Hayashi | ............. G01N 27/4078 73/31.05 |
| 2006/0237315 A1* | 10/2006 | Matsuo | ............. G01N 27/4062 204/424 |

(Continued)

FOREIGN PATENT DOCUMENTS

| EP | 0677747 A2 | 10/1995 |
| EP | 3115792 A1 | 1/2017 |
| JP | 2017-009576 | 1/2017 |

OTHER PUBLICATIONS

"Testing Insulated Wires Just Got Easier", Machine Design, Penton Media, Cleveland, OH, US, vol. 73, No. 1, XP001198876, Jan. 11, 2001, pp. 54.

(Continued)

*Primary Examiner* — Alvaro E Fortich
*Assistant Examiner* — Zannatul Ferdous
(74) *Attorney, Agent, or Firm* — Greenblum & Bernstein, P.L.C.

(57) ABSTRACT

A sensor detects a detected value for a covered wire without metallic contact, and includes: a tubular support that has a male thread and an insertion channel in which the covered wire is inserted and supported; a tubular shell that is inserted into the support from a base end; a pillar-shaped detection electrode that is inserted in and supported by the shell; and a tubular threaded piece that screws onto the male thread, is rotatably attached onto the shell, and is moved, along the axis of the support, together with the shell and the detection electrode by a screwing operation. The detection electrode is configured so that the front surface is pressed onto the covered wire in the support when the detection electrode moves, resulting in the front surface becoming capacitively coupled to a core wire of the covered wire via an insulating covering.

14 Claims, 9 Drawing Sheets

(56) References Cited

U.S. PATENT DOCUMENTS

| | | | | |
|---|---|---|---|---|
| 2011/0121820 A1* | 5/2011 | Handshoe | .......... | G01R 27/2605 |
| | | | | 324/126 |
| 2013/0099792 A1* | 4/2013 | Patti | ........................ | H01T 21/02 |
| | | | | 324/399 |
| 2016/0202291 A1* | 7/2016 | Gilbert | ................. | G01R 15/148 |
| | | | | 324/750.25 |
| 2016/0377662 A1 | 12/2016 | Kasai | | |

OTHER PUBLICATIONS

Search Report issued in EP Patent Application No. 18211518.8, dated Jul. 2, 2019.

* cited by examiner

SENSOR AND MEASURING APPARATUS

FIELD OF THE INVENTION

The present invention relates to a sensor capable of detecting a detected value for a covered wire without metallic contact, and a measuring apparatus equipped with this sensor.

DESCRIPTION OF THE RELATED ART

One known example of this type of sensor is the voltage detecting probe disclosed by the present applicant in Patent Literature 1 (Japanese Laid-open Patent Publication No. 2017-9576). This voltage detecting probe includes a grip and a detection electrode unit. The detection electrode unit includes a first shield tube, which has an insertion concave, into which a measured wire can be inserted, formed in a front end thereof, a detection electrode housed inside the first shield tube, and the like. In this voltage detecting probe, the first shield tube is constructed so as to be movable in the axial direction relative to the grip and is biased toward the grip by a coil spring. When detecting the voltage of the measured wire using this voltage detecting probe, the first shield tube is moved against the biasing force of the coil spring toward the front end to set the insertion concave at the front end of the first shield tube in an open state. After this, the measured wire is fitted inside the insertion concave and then the force that acted upon the first shield tube from a direction facing the front end is released. When this happens, the first shield tube moves toward the grip due to the biasing force of the coil spring, so that the measured wire becomes clamped by the front end surface of the detection electrode and the edges of the insertion concave. After this, the detection electrode detects the voltage of the measured wire and outputs a detection signal.

Here, with the voltage detecting probe described above, since the first shield tube is moved toward the grip using the biasing force of the coil spring and the measured wire is clamped by the front end surface of the detection electrode and the edges of the insertion concave, when the measured wire vibrates and/or an external force is applied to the voltage detecting probe, there is the risk that the degree of contact between the front end surface of the detection electrode and the measured wire will fluctuate, which makes the output of the detection signal unstable and lowers the detection accuracy. For this reason, the present applicant has developed an improved, screw-type voltage sensor. This screw-type voltage sensor includes a support in which an insertion concave for inserting the measured wire is formed and also has a female thread formed in the inner circumferential surface, a threaded piece that has a male thread that screws into the female thread formed in an outer circumferential surface, and an electrode that is inserted into the threaded piece and supported by the threaded piece in that state. With this voltage sensor, by performing an operation that screws the male thread into the female thread, the electrode is moved toward the front end of the support so that the front end surface of the electrode comes into contact with the measured wire, at which point the electrode detects the voltage of the measured wire and outputs a detection signal. To prevent a cable, which transmits the detection signal to measuring equipment, from twisting during the screwing operation, a connector for connecting the cable is provided on the voltage sensor.

SUMMARY OF THE INVENTION

However, the screw-type voltage sensor developed by the applicant has the following problem to be solved. Since the cable for transmitting the detection signal is connected via a connector, compared to a configuration where the cable is directly connected without using a connector, this voltage sensor has a problem of reduced strength (i.e., reduced vibration resistance) for the connection between the voltage sensor and the cable. With this voltage sensor, since the front end surface of the electrode is placed in contact with the measured wire by a screwing operation, a force in the direction of rotation of the electrode (that is, a twisting direction) is applied to the measured wire, resulting in another problem of a risk of damage to the measured wire.

The present invention was conceived to solve the problems described above and has a principal object of providing a sensor and measuring apparatus capable of increasing the connection strength between a sensor and a cable and preventing damage to a measured wire.

To achieve the stated object, a sensor according to the present invention is capable of detecting a detected value for a covered wire without metallic contact, and comprises: a support that is formed in a tubular shape, has a male thread formed on an outer circumferential surface thereof, is provided with an insertion channel formed by cutting away part of a circumferential wall, and is capable of supporting the covered wire that has been inserted into the insertion channel; a shell that is formed in a tubular shape and is capable of being inserted into the support from a base end side of the support; a detection electrode that is formed in a pillar shape, is supported by the shell in a state where the detection electrode has been inserted inside the shell, and is inserted together with the shell into the support; and a threaded piece that is formed in a tubular shape, has a female thread that screws onto the male thread formed on an inner circumferential surface thereof, is externally attached to the shell so as to be rotatable with respect to the shell, and is capable of being moved along a direction of an axis, which joins the base end and a front end of the support, together with the shell and the detection electrode that have been inserted into the support by a screwing operation that screws the female thread onto the male thread, wherein the detection electrode is configured so that a front end surface thereof is capable of becoming capacitively coupled to a core wire of the covered wire via an insulating covering of the covered wire when the front end surface is pressed onto the covered wire that is supported on the support due to movement of the detection electrode toward a front end side of the support.

In this way, according to the sensor according to the present invention and the measuring apparatus according to the present invention that is equipped with this sensor, by including the threaded piece that has the female thread, which is screwed onto the male thread formed on the outer circumferential surface of the circumferential wall of the support, formed on the inner circumferential surface, that is externally attached to the shell so as to be rotatable with respect to the shell, and that is capable of moving together with the shell and the detection electrode along the direction of the axis of the support due to a screwing operation, in a case where a shielded cable has been connected to the shell for example, it is possible, by performing a screwing operation that screws on the female thread of the threaded piece while gripping the shielded cable to prevent the shell from rotating, to (linearly) move the shell and the detection electrode along the axis direction toward the front end side of the support without the shell and the detection electrode rotating due to the screwing operation. This means that according to the sensor and the measuring apparatus, it is possible to reliably prevent a situation where the covered wire is damaged due to a force being applied to the covered wire in a direction of rotation of the detection electrode (a twisting direction). Also, according to the sensor and the measuring apparatus, since it is possible to linearly move the shell and the detection electrode without the shell and the detection electrode rotating due to the screwing operation, it is possible to directly connect the detection electrode and the shell to the shielded cable without using a connector to prevent twisting of the shielded cable connected to the shell and the detection electrode. This means that according to the sensor and the measuring apparatus, compared to a configuration where the detection electrode and the shell are connected to the shielded cable using a connector, it is possible to sufficiently increase the connection strength between the detection electrode and shell and the shielded cable and to sufficiently improve the resistance to vibration. Therefore, according to the sensor and the measuring apparatus, even if the covered wire vibrates and/or an external force is applied to the sensor, it is possible to maintain the state where the detection electrode and the shell are reliably connected to the shielded cable and to reliably detect the voltage of the covered wire.

Also, a sensor according to the present invention is capable of of detecting a detected value for a covered wire without metallic contact, and comprises: a support that is formed in a tubular shape, is provided with an insertion channel formed by cutting away part of a circumferential wall, and is capable of supporting the covered wire that has been inserted into the insertion channel; a shell that is formed in a tubular shape, has a male thread formed on an outer circumferential surface thereof, and is capable of being inserted into the support from a base end side of the support; a detection electrode that is formed in a pillar shape, is supported by the shell in a state where the detection electrode has been inserted inside the shell, and is inserted together with the shell into the support; and a threaded piece that is formed in a tubular shape, has a female thread that screws onto the male thread formed on an inner circumferential surface thereof, is externally attached to the support so as to be rotatable with respect to the support, and moves the shell and the detection electrode, which have been inserted into the support, along a direction of an axis that joins the base end and a front end of the support by a screwing operation that screws the female thread onto the male thread, wherein the detection electrode is configured so that a front end surface thereof is capable of becoming capacitively coupled to a core wire of the covered wire via an insulating covering of the covered wire when the front end surface is pressed onto the covered wire that is supported on the support due to movement of the detection electrode toward a front end side of the support.

In this way, according to the sensor according to the present invention and the measuring apparatus according to the present invention that is equipped with this sensor, by including the threaded piece that has the female thread, which is screwed onto the male thread formed on the outer circumferential surface of the circumferential wall of the shell, formed on the inner circumferential surface, that is externally attached to the support so as to be rotatable with respect to the support, and that is capable of moving the shell and the detection electrode along the direction of the axis of the support due to a screwing operation, in a case where a shielded cable has been connected to the shell for example, it is possible, by performing a screwing operation that screws on the female thread of the threaded piece while gripping the support to prevent the support from rotating, to (linearly) move the shell and the detection electrode along the axis direction toward the front end side of the support without the shell and the detection electrode rotating due to the screwing operation. This means that according to the sensor and the measuring apparatus, it is possible to reliably prevent a situation where the covered wire is damaged due to a force being applied to the covered wire in a direction of rotation of the detection electrode (a twisting direction). Also, according to the sensor and the measuring apparatus, since it is possible to linearly move the shell and the detection electrode without the shell and the detection electrode rotating due to the screwing operation, it is possible to directly connect the detection electrode and the shell to the shielded cable without using a connector to prevent twisting of the shielded cable connected to the shell and the detection electrode. This means that according to the sensor and the measuring apparatus, compared to a configuration where the detection electrode and the shell are connected to the shielded cable using a connector, it is possible to sufficiently increase the connection strength between the detection electrode and shell and the shielded cable and to sufficiently improve the resistance to vibration. Therefore, according to the sensor and the measuring apparatus, even if the covered wire vibrates and/or an external force is applied to the sensor, it is possible to maintain the state where the detection electrode and the shell are reliably connected to the shielded cable and to reliably detect the voltage of the covered wire.

Further, in the sensor according to the present invention, the support and the shell are provided with a guide that guides the shell in the direction of the axis and prevents rotation of the shell relative to the support due to the screwing operation.

In this way, according to the sensor according to the present invention and the measuring apparatus according to the present invention that is equipped with this sensor, by providing the support and the shell with the guide, that prevents rotation of the shell with respect to the support due to the screwing operation and guides the shell in the axis direction, even when an operation of gripping the shielded cable connected to the shell is not performed, it is still possible to guide the shell and the detection electrode in the axis direction and attach the sensor to the covered while reliably preventing rotation of the shell and the detection electrode with respect to the support due to the screwing operation. This means that according to the sensor and the measuring apparatus, it is possible to sufficiently improve operability when attaching the sensor to the covered wire.

Also, in the sensor according to the present invention, the support, the shell, and the threaded piece are conductive and configured so as to become a same potential, and the detection electrode is supported by the shell so as to be insulated from the shell.

In this way, according to the sensor according to the present invention and the measuring apparatus according to the present invention that is equipped with this sensor, by using a configuration where the support, the shell, and the threaded piece are conductive and become the same potential, it is possible to cause the support, the shell, and the threaded piece to function as a shield. This means that it is possible to sufficiently reduce the influence of external disruptions on the detection electrode, and as a result, it is possible to further improve the detection accuracy for the voltage of the covered wire.

Further, in the sensor according to the present invention, the insertion channel includes: a pair of first cutaways provided along the direction of the axis at facing positions on the circumferential wall at an intermediate position between the front end and the base end of the support; and a second cutaway that is provided in the circumferential wall along a direction perpendicular to the direction of the axis so as to join base end-side ends of the first cutaways.

In this way, according to the sensor according to the present invention and the measuring apparatus according to the present invention that is equipped with this sensor, by constructing the insertion channel of a pair of first cutaways, which are provided along the axis direction at facing positions on the circumferential wall of the support, and the second cutaway, which is provided in the circumferential wall along a direction that is perpendicular to the axis direction so as to join the base end-side ends of the first cutaways, it is possible, for example by positioning the second cutaway below the covered wire and moving the support (the sensor) upward and then moving the support toward the base end side, to easily position the covered wire at a front end-side end of the support inside the first cutaways. In this state, it is possible to reliably prevent the covered wire from coming out of the insertion channel. This means that according to the sensor and the measuring apparatus, it is possible to easily and reliably support the covered wire using the support.

Further, in the sensor according to the present invention, the threaded piece includes an operator for the screwing operation that has facing flat surfaces.

In this way, according to the sensor according to the present invention and the measuring apparatus according to the present invention that is equipped with this sensor, by providing the operator for a screwing operation that has facing flat surfaces on the threaded piece and gripping the flat surfaces of the operator with the fingertips or a tool such as a spanner during a screwing operation, it is possible to reliably screw the female thread onto the male thread. This means that according to the sensor and the measuring apparatus, it is possible to more reliably press the covered wire with the front end surface of the detection electrode, and as a result, it is possible to significantly improve the detection accuracy of the voltage of the covered wire.

Also, the sensor according to the present invention further comprises a shielded cable and a connector that connects a core wire of the shielded cable and the detection electrode and also connects a shield conductor of the shielded cable and the shell, wherein the connector includes a socket and a connector pipe that are conductive, the socket is capable of connecting a front end of the core wire of the shielded cable and the base end of the detection electrode, which have been inserted from respective end sides of the socket, and the connector pipe is capable of connecting the shell and the shield conductor by being crimped in a state where the shield conductor has been disposed on the outer circumferential surface of the shell and inserted in the connector pipe.

In this way, according to the sensor according to the present invention and the measuring apparatus according to the present invention that is equipped with this sensor, the connector is constructed so as to include the socket and the connector pipe that are conductive. This means that according to the sensor and the measuring apparatus, by merely inserting the core wire of the shielded cable into one end of the socket and inserting the base end of the detection electrode into the other end of the socket, it is possible to easily connect the detection electrode and the core wire of the shielded cable. Also, by attaching the connector pipe to the periphery of the shield conductor of the shielded cable that covers the shell and crushing and crimping the connector pipe, it is possible to easily connect the shell 4 and the shield conductor. This means that according to the sensor and the measuring apparatus, it is possible to sufficiently improve the efficiency of the task of connecting the shell and detection electrode to the shielded cable.

A measuring apparatus according to the present invention comprises: the sensor according to any one of the sensors described above; a measuring apparatus body connected to the sensor; a voltage detector that is disposed inside the measuring apparatus body, detects a voltage of the covered wire as the detected value via the detection electrode, and outputs a voltage signal that changes in keeping with the voltage; a voltage generator that is disposed inside the measuring apparatus body and generates a voltage that follows the voltage of the covered wire based on the voltage signal; and a processor that is disposed inside the measuring apparatus body and measures the voltage of the covered wire based on the voltage generated by the voltage generator, wherein the voltage detector operates on a floating voltage that has a potential of the voltage generated by the voltage generator as a reference. Therefore, according to the measuring apparatus, it is possible to achieve such effects as described above.

It should be noted that the disclosure of the present invention relates to the contents of Japanese Patent Application No. 2017-247539 that was filed on Dec. 25, 2017, the entire contents of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a sensor and a measuring apparatus will now be described with reference to the attached drawings.

Figure 6:
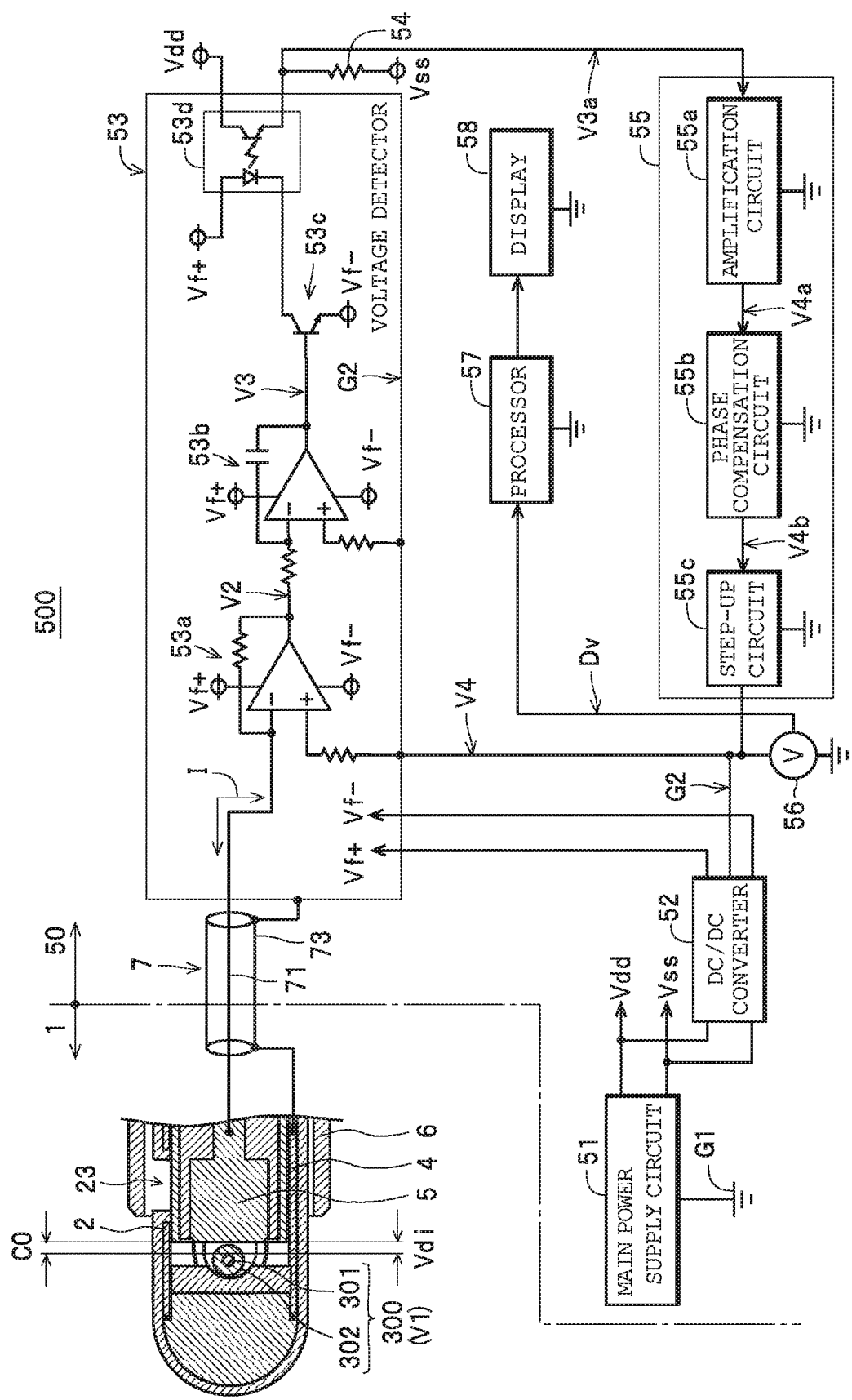
FIG. 6 is a block diagram of a measuring apparatus 500.

First, as an example of a sensor, the configuration of a voltage sensor 1 depicted in FIGS. 1 and 2 will be described. The voltage sensor 1 is a voltage sensor that is used to detect a voltage (one example of a "detected value" of a covered wire, hereinafter also referred to as a "voltage V1 of the wire 300") being supplied to a covered wire (as one example, a wire 300 including a core wire 301 and an insulating covering 302 as depicted in FIG. 6) without metallic contact (i.e., without contacting conductors such as the core wire 301). As depicted in FIG. 6, together with a measuring apparatus body 50, the voltage sensor 1 constructs a measuring apparatus 500 as one example of a "measuring apparatus" for the present invention.

Figure 1:
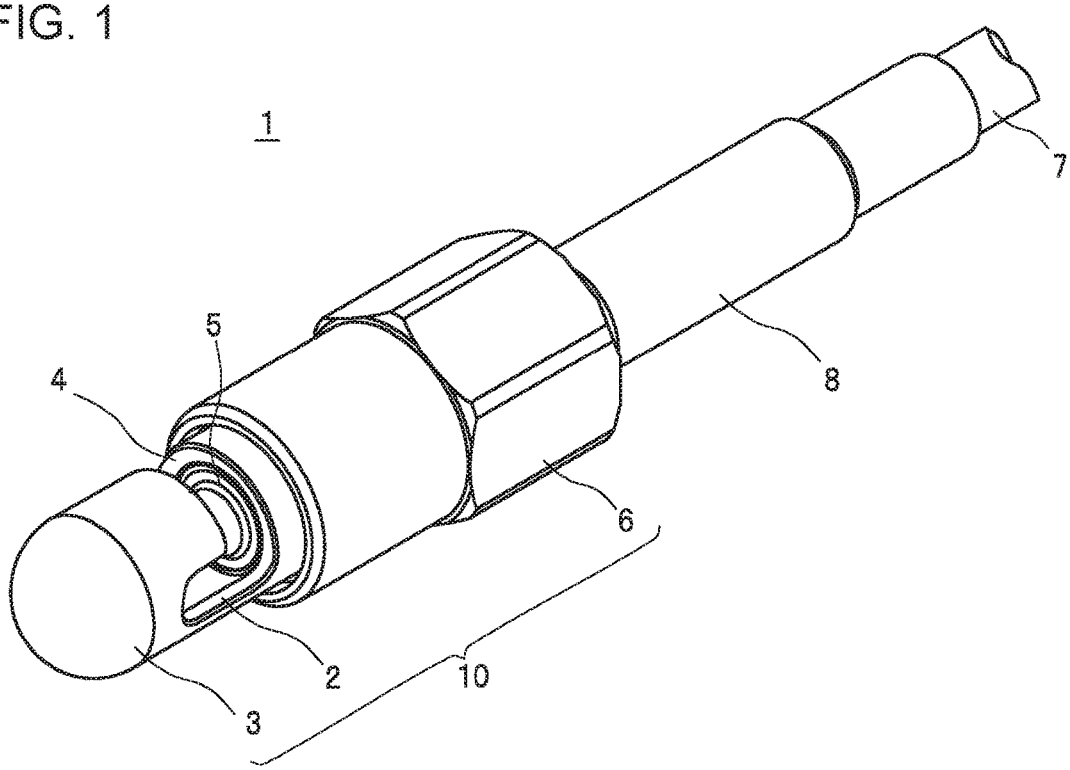
FIG. 1 is a perspective view of a voltage sensor 1.
Figure 2:
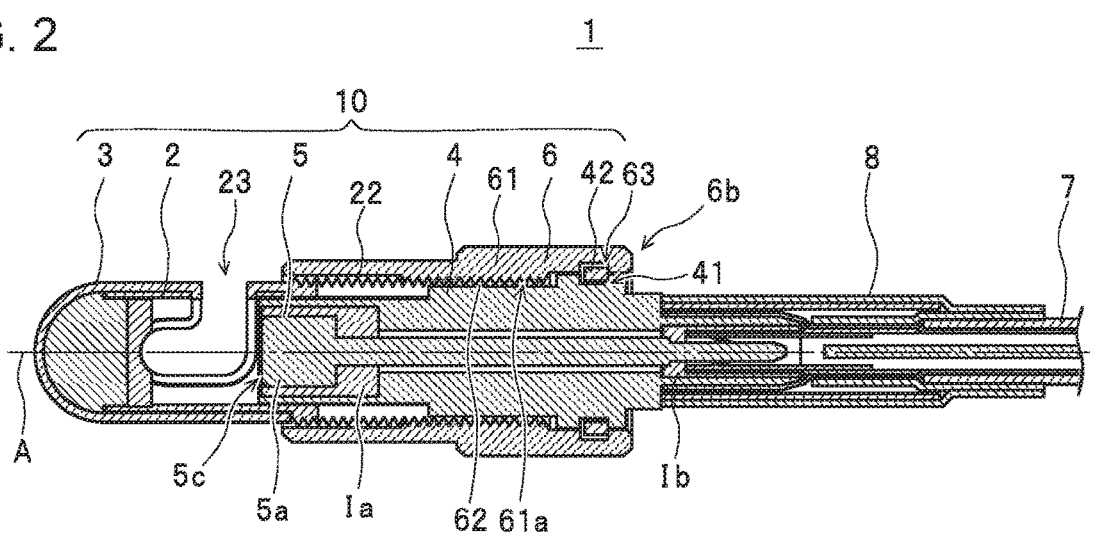
FIG. 2 is a cross-sectional view of the voltage sensor 1.
Figure 3:
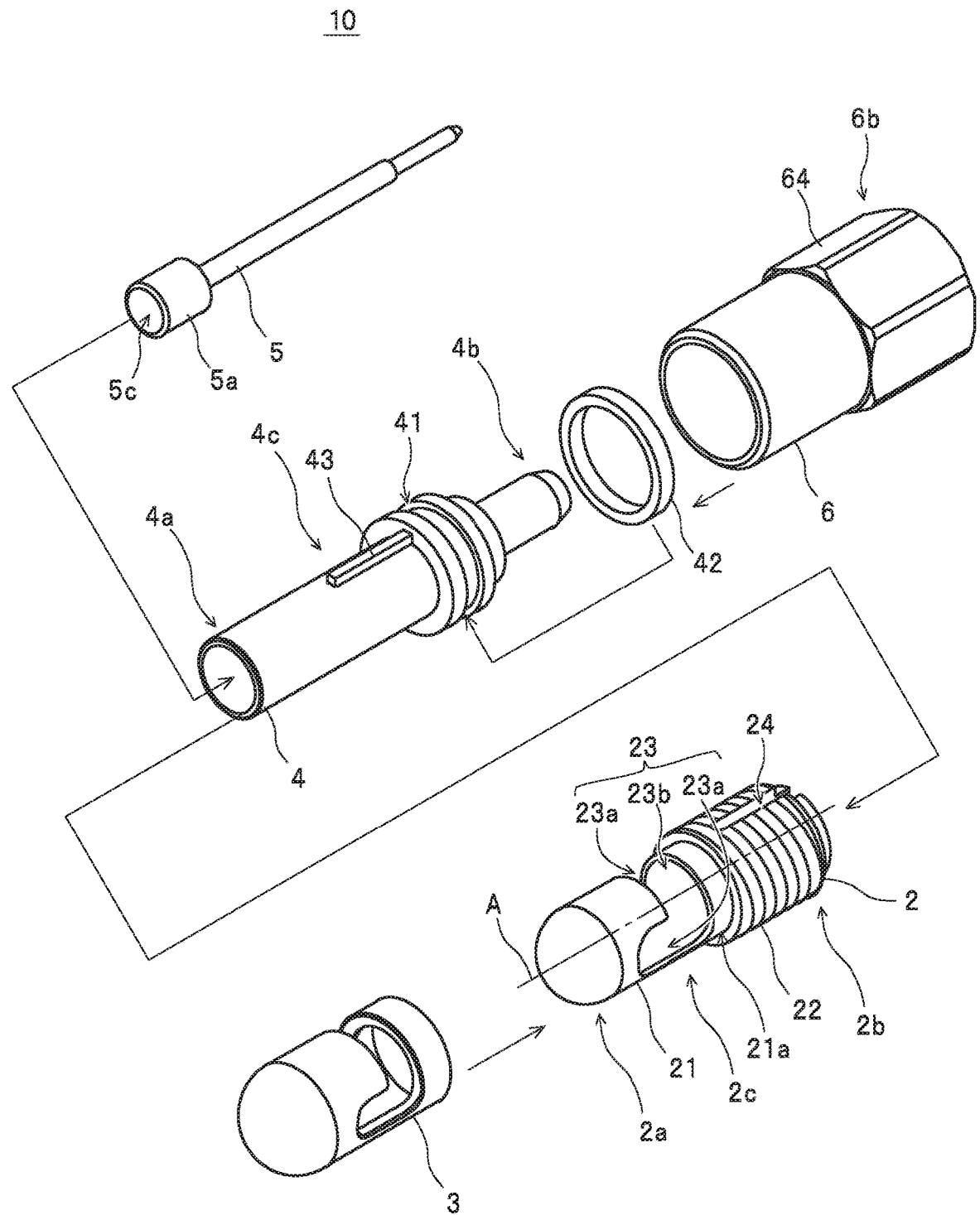
FIG. 3 is an exploded perspective view of a main body 10.

As depicted in FIGS. 1 to 3, the voltage sensor 1 includes a support 2, a protective cap 3, a shell 4, a detection electrode 5, a threaded piece 6, a shielded cable 7, and a connector 8. Note that in the following description, the part of the voltage sensor 1 aside from the shielded cable 7 and the connector 8 is also referred to as a "main body 10".

The support 2 is a member that supports the wire 300, and as depicted in FIG. 3, is formed in the shape of a round tube (one example of a "tubular shape") whose front end 2a is covered and whose base end 2b is open. Here, the front end 2a of the support 2 is formed so that its surface is curved (in substantially a hemispherical shape). As depicted in FIG. 3, a male thread 22 is formed on an outer circumferential surface 21a of a circumferential wall 21 at the base end 2b side of the support 2. A slit 24 that extends along the direction of an axis A (see FIGS. 2 and 3) that joins the front end 2a and the base end 2b is formed in the circumferential wall 21 at the base end 2b side.

Figure 8:
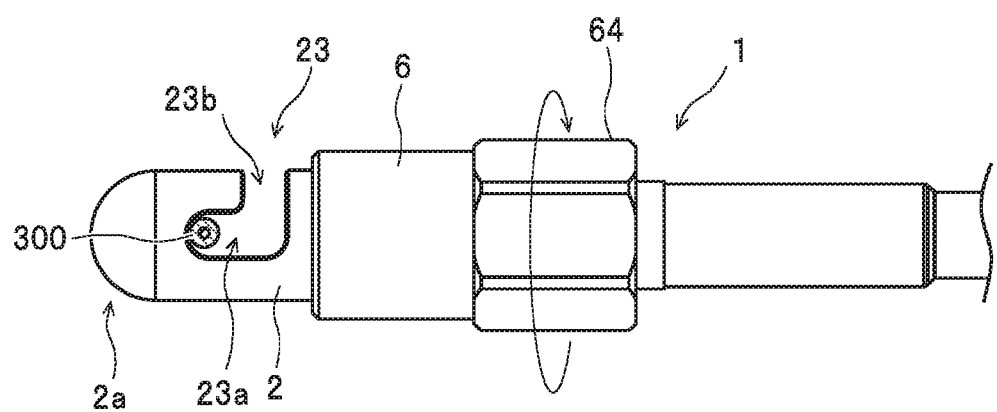
FIG. 8 is a second diagram useful in explaining a method of using the voltage sensor 1.

As depicted in FIG. 3, the support 2 is also provided with an insertion channel 23 formed by cutting away part of the circumferential wall 21 to enable insertion of the wire 300. Here, as one example, as depicted in FIG. 3, the insertion channel 23 includes, at an intermediate position 2c on the support 2, a pair of cutaways 23a (or "first cutaways") that are provided along the axis A direction at facing positions on the circumferential wall 21 and a cutaway 23b (or "second cutaway") that is provided in the circumferential wall 21 along a direction that is perpendicular to the axial direction so as to join base end 2b side-ends of the cutaways 23a. As depicted in FIG. 8, the support 2 is capable of supporting the wire 300 in a state where the wire 300 has been inserted into the insertion channel 23.

The support 2 is formed of a conductive material and is electrically connected via the threaded piece 6 to the shell 4 so as to be kept at the same potential as the shell 4. The surface of the support 2 is also insulated so as to prevent external shorting. In more detail, an insulating layer is formed on the surface of the support 2 by a coating process using an insulating material.

As depicted in FIG. 3, the protective cap 3 is attached to the front end 2a side of the support 2 and protects the support 2.

As depicted in FIGS. 2 and 3, the shell 4 is formed in the overall shape of a round tube (one example of a "tubular shape") and is capable of supporting the detection electrode 5. As depicted in FIGS. 2 and 3, the shell 4 is constructed so that a front end 4a side thereof can be inserted into the support 2 from the base end 2b side of the support 2. As depicted in FIG. 3, a channel 41 is formed in a base end 4b side of the shell 4 and a ring 42 is attached to the channel 41 (see FIG. 2 also). A key (or "protrusion") 43 is formed in a center 4c of the shell 4. Together with the slit 24 of the support 2, the key 43 constructs a guide. In a state where the front end 4a side is inserted inside the support 2, the key 43 fits into the slit 24 and functions so as to guide the shell 4 in the axis A direction to prevent rotation of the shell 4 with respect to the support 2 due to a screwing operation described later. The shell 4 is also formed of a conductive material, is connected to a reference potential of the measuring apparatus body 50 via a braided shield 73 of the shielded cable 7 described later, and functions, together with the support 2 and the threaded piece 6 as a shield that reduces the influence of external disruptions on the detection electrode 5.

As depicted in FIG. 3, the detection electrode 5 is formed as a circular pillar (one example of a "pillar shape") of a conductive material. As depicted in FIG. 2, the detection electrode 5 is inserted inside the shell 4 in a state where the detection electrode 5 is insulated from the shell 4 by insulators Ia and Ib formed of nonconductive material, and is supported by the shell 4.

The detection electrode 5 is inserted together with the shell 4 into the support 2, moves to the front end 2a of the support 2, and when a front end surface 5c of a front end 5a is pressed against the wire 300 supported by the support 2, the front end surface 5c becomes capacitively coupled to the core wire 301 of the wire 300 via the insulating covering 302 of the wire 300. The detection electrode 5 is also connected via a core wire 71 of the shielded cable 7, described later, to the measuring apparatus body 50.

As depicted in FIGS. 2 and 3, the threaded piece 6 is formed in the shape of a round tube (one example of a "tubular shape"). As depicted in FIG. 2, a female thread 62 that screws onto the male thread 22 of the support 2 is formed on an inner circumferential surface 61a of a circumferential wall 61 of the threaded piece 6. A channel 63 is also formed in a base end 6b side of the threaded piece 6. As depicted in the drawings, since the voltage sensor 1 is configured so that the ring 42 attached to the shell 4 fits into the channel 63 of the threaded piece 6, the threaded piece 6 is externally attached to the shell 4 so as to be rotatable with respect to the shell 4 (that is, the shell 4 and the threaded piece 6 are rotatably linked via the ring 42). With the voltage sensor 1, by performing a screwing operation that screws the female thread 62 of the threaded piece 6 onto the male thread 22 of the support 2, it is possible to move the threaded piece 6 together with the shell 4 and the detection electrode 5 inserted inside the support 2 along the axis A direction.

Figure 12:
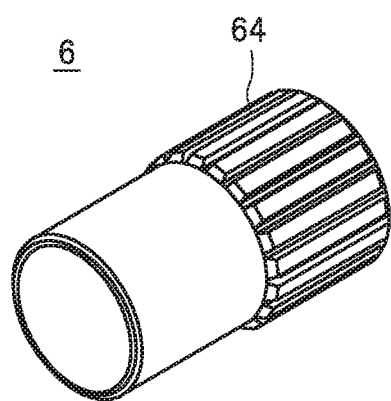
FIG. 12 is a perspective view depicting another configuration of a threaded piece 6.

Also, as depicted in FIG. 3, an operator 64 used during a screwing operation is provided on the base end 6b side of the threaded piece 6. As one example, the operator 64 is formed in a hexagonal shape (in the form of a hexagonal nut) when viewed from above, and has three pairs of facing flat surfaces. The threaded piece 6 is formed of a conductive material and is electrically connected to the shell 4 and the support 2. Note that in place of the operator 64 that has facing flat surfaces, as depicted in FIG. 12, it is also possible to use a threaded piece 6 with an operator 64 that has been subjected to flat eye knurling as an anti-slip treatment.

Figure 5:
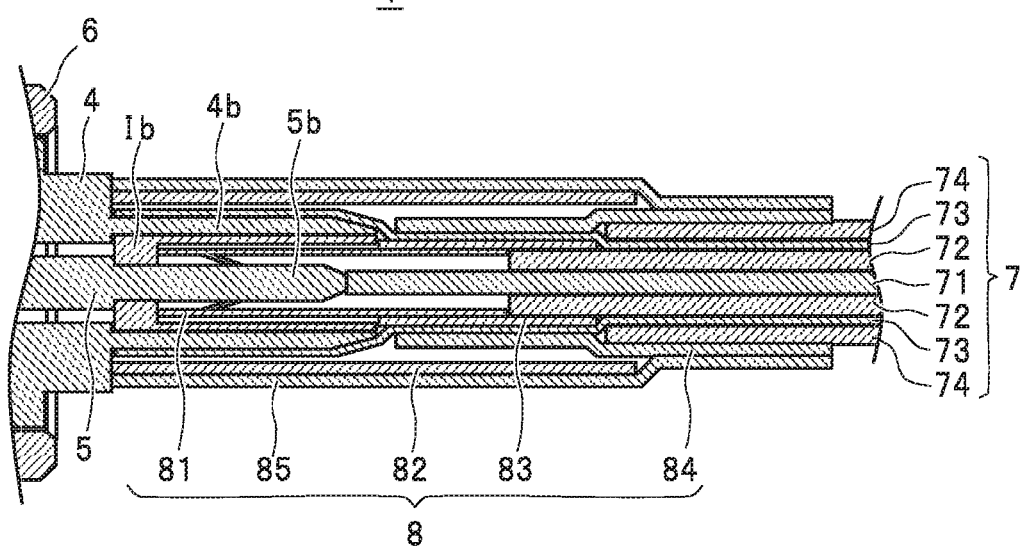
FIG. 5 is a cross-sectional view useful in explaining a state where the main body 10 and a shielded cable 7 are connected using the connector 8.

The shielded cable 7 is a coaxial cable and as depicted in FIG. 5, includes the core wire 71, an insulating layer 72, the braided shield (or "shield conductor") 73, and a covering 74, which are formed in concentric layers.

Figure 4:
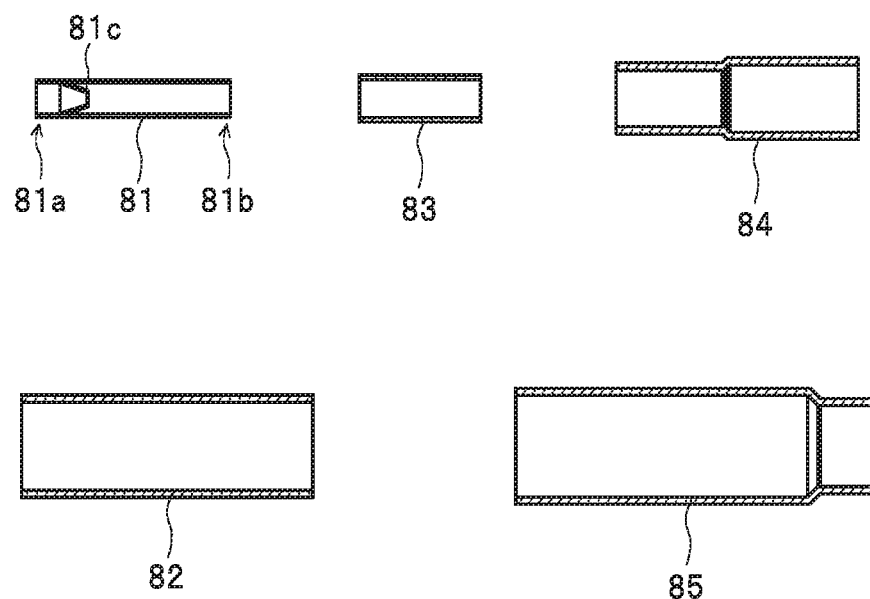
FIG. 4 is a cross-sectional view of components that construct a connector 8.

As depicted in FIGS. 4 and 5, the connector 8 includes a socket 81, a connector pipe 82, and insulating tubes 83 to 85. The connector 8 electrically connects the shielded cable 7 and the main body 10. The connector 8 connects the core wire 71 of the shielded cable 7 and the detection electrode 5 and also connects the braided shield 73 of the shielded cable 7 and the shell 4.

As depicted in FIG. 4, the socket 81 is formed of a conductive material, such as metal, in the shape of a tube. Also, as depicted in FIG. 5, the socket 81 connects a front end of the core wire 71 of the shielded cable 7 that has been inserted from a base end 81*b* (see FIG. 4) of the socket 81 and a base end 5*b* of the detection electrode 5 that has been inserted from a front end 81*a* (see FIG. 4) of the socket 81. Also, as depicted in FIG. 4, a claw 81*c* that protrudes inward is formed at a front end 81*a* side of the socket 81, and due to the detection electrode 5 inserted inside the socket 81 engaging the claw 81*c*, it is possible to prevent the detection electrode 5 from coming out of the socket 81.

As depicted in FIG. 4, the connector pipe 82 is formed of a conductive material, such as metal, in the shape of a tube. As depicted in FIG. 5, the base end 4*b* of the shell 4 is covered with the braided shield 73 that has been pulled out from the shielded cable 7, the braided shield 73 and the base end 4*b* are inserted in the connector pipe 82, and the connector pipe 82 is crushed by crimping in this state so that the connector pipe 82 functions to connect the braided shield 73 and the base end 4*b* of the shell 4.

As depicted in FIG. 4, the insulating tubes 83 to 85 are each formed in the shape of a tube using a non-conductive material, such as resin. Here, as depicted in FIG. 5, the insulating tube 83 is disposed so as to cover the socket 81, which connects the base end 5*b* of the detection electrode 5 and the core wire 71 of the shielded cable 7, and the insulating layer 72 of the shielded cable 7, and insulates the socket 81 and the braided shield 73 from each other. As depicted in FIG. 5, the insulating tube 84 is disposed so as to cover an exposed part of the braided shield 73 of the shielded cable 7 and tightly attaches the braided shield 73 and the insulating tube 83. As depicted in FIG. 5, the insulating tube 85 is disposed so as to cover the connector pipe 82 and insulates the connector pipe 82. Note that as one example, the insulating tubes 83 to 85 are composed of heat shrink tubing that shrinks when heat is applied.

As depicted in FIG. 6, as one example, the measuring apparatus body 50 includes a main power supply circuit 51, a DC/DC converter (hereinafter, simply referred to as a "converter") 52, a voltage detector 53, a resistor 54 for current-to-voltage conversion, a voltage generating unit 55, a voltmeter 56, a processing unit 57, and a display unit 58.

The main power supply circuit 51 outputs a positive voltage Vdd and a negative voltage Vss (DC voltages with different polarities but the same absolute value generated with the potential of ground G1 (the first reference potential) as a reference) for driving the various component elements 53 to 58 of the measuring apparatus body 50. As one example, the converter 52 includes an insulated transformer with a primary winding and a secondary winding that are electrically insulated from each other, a drive circuit that drives the primary winding of the transformer, and a DC converting unit that rectifies and smoothes an AC voltage induced in the secondary winding of the transformer (none of such components are depicted), and is configured as an insulated power supply where the secondary side is insulated from the primary side.

With this converter 52, the drive circuit operates based on the inputted positive voltage Vdd and negative voltage Vss, and the primary winding of the transformer is driven in a state where the positive voltage Vdd is applied to induce an AC voltage in the secondary winding. The DC converting unit rectifies and smoothes this AC voltage. By doing so, from the secondary side of the converter 52, a positive voltage Vf+ and a negative voltage Vf− that have an internal reference potential (second reference potential) G2 on the secondary side as a reference are generated in a floating state (a state where the ground G1, the positive voltage Vdd, and the negative voltage Vss are electrically separated). The positive voltage Vf+ and the negative voltage Vf− as floating voltages generated in this way are supplied together with the second reference potential G2 to the voltage detector 53. Note that the positive voltage Vf+ and the negative voltage Vf− are generated as DC voltages with different polarities and substantially equal absolute values.

The voltage detector 53 includes a current-to-voltage converting circuit 53*a*, an integrating circuit 53*b*, a drive circuit 53*c*, and an insulating circuit 53*d* (although a photocoupler driven by the drive circuit 53*c* is illustrated in FIG. 6 as an example, it is also possible to use various other configurations, such as an insulating transformer, in place of a photocoupler) and, in a state where the reference potential of the voltage detector 53 is set at the second reference potential G2 described above, is driven by receiving supply of the positive voltage Vf+ and the negative voltage Vf− from the converter 52.

As one example, the current-to-voltage converting circuit 53*a* is configured so as to include a first operational amplifier whose non-inverting input terminal is connected via a resistor to a part of the voltage detector 53 that is set at the second reference potential G2 (hereinafter, also referred to as being "connected to the second reference potential G2"), whose inverting input terminal is connected to the core wire 71 of the shielded cable 7 (that is, to the detection electrode 5 of the voltage sensor 1 via the core wire 71), and has a feedback resistor connected between the inverting input terminal and the output terminal. With this current-to-voltage converting circuit 53*a*, the first operational amplifier operates on the positive voltage Vf+ and the negative voltage Vf− and converts a detection current (current signal) I, which flows between the wire 300 and the detection electrode 5 due to a potential difference Vdi (see FIG. 6) between the voltage V1 of the wire 300 and the second reference potential G2 (which is also the voltage of a voltage signal V4 outputted from the voltage generating unit 55) with a current value in keeping with such potential difference Vdi, to a detection voltage signal V2 and outputs the detection voltage signal V2. Here, the detection voltage signal V2 has an amplitude that changes in proportion to the amplitude of the current signal I.

As one example, the integrating circuit 53*b* is configured so as to include a second operational amplifier whose non-inverting input terminal is connected via a resistor to the second reference potential G2, whose inverting input terminal is connected via an input resistor to the output terminal of the first operational amplifier, and has a feedback capacitor connected between the inverting input terminal and the output terminal. In this integrating circuit 53*b*, the second operational amplifier operates on the positive voltage Vf+ and the negative voltage Vf− and by integrating the detection voltage signal V2, an integrated signal V3 whose voltage value changes in proportion with the potential difference Vdi described above is generated and outputted.

The drive circuit 53*c* drives the insulating circuit 53*d* in keeping with the level of the integrated signal V3 in a linear region, and the driven insulating circuit 53*d* electrically separates this integrated signal V3 and outputs as a new integrated signal (first signal) V3*a*. That is, in combination with the voltage sensor 1, the voltage detector 53 outputs the integrated signal V3*a* that indicates the voltage V1 of the wire 300.

One end of the resistor 54 for current-to-voltage conversion is connected to the negative voltage Vss and the other end is connected to the corresponding insulating circuit 53d (in the present embodiment, the collector terminal of the phototransistor of the photocoupler) in the voltage detector 53.

By inputting and amplifying the integrated signal V3a, the voltage generating unit 55 generates the voltage signal V4 and applies the voltage signal V4 to a part of the voltage detector 53 that is set at the second reference potential G2. The voltage of the voltage signal V4 changes in accordance with the voltage V1 of the wire 300, as described later. By doing so, the positive voltage Vf+ and the negative voltage Vf− that are floating voltages that have the second reference potential G2 as a reference are floating voltages that change in accordance with the voltage of the voltage signal V4.

The voltage generating unit 55 forms a feedback loop together with the second reference potential G2 of the voltage detector 53 (the braided shield 73 of the shielded cable 7 that is at same potential as the second reference potential G2), the detection electrode 5 and the voltage detector 53 (the current-to-voltage converting circuit 53a, the integrating circuit 53b, the drive circuit 53c, and the insulating circuit 53d (in the present embodiment, a photocoupler), and generates the voltage signal V4 by performing an amplification operation that amplifies the integrated signal V3a so as to reduce the potential difference Vdi.

Also, as one example, as depicted in FIG. 6, the voltage generating unit 55 includes an amplification circuit 55a, a phase compensation circuit 55b, and a step-up circuit 55c. Here, the amplification circuit 55a inputs and amplifies the integrated signal V3a to generate a voltage signal V4a. In this case, the amplification circuit 55a performs an amplification operation to generate the voltage signal V4a where the absolute value of the voltage value changes corresponding to increases and decreases in the absolute value of the voltage value of the integrated signal V3a. To improve the stability of feedback control operations (to prevent oscillation), the phase compensation circuit 55b inputs the voltage signal V4a, adjusts the phase of the voltage signal V4a, and outputs as a voltage signal V4b. The step-up circuit 55c is constructed of a step-up transformer, for example, and by boosting the voltage signal V4b with a predetermined magnification (i.e., by increasing the absolute value without changing the polarity), generates the voltage signal V4 and applies the voltage signal V4 to the second reference potential G2. The voltmeter 56 measures the voltage signal V4 with the potential of the ground G1 as a reference, converts the voltage value to digital data, and outputs as voltage data Dv.

The processing unit 57 includes a CPU and memory (neither is illustrated), and executes a voltage calculating process that calculates the voltage V1 of the wire 300 based on the voltage data Dv outputted from the voltmeter 56. The processing unit 57 has the voltage V1 calculated by the voltage calculating process displayed on the display unit 58 in the form of a table or a graph. The display unit 58 is constructed of a monitor apparatus, such as a liquid crystal display.

Next, a method of using the voltage sensor 1 and the measuring apparatus 500 to measure the voltage V1 being supplied to the wire 300 will be described with reference to the drawings.

Figure 7:
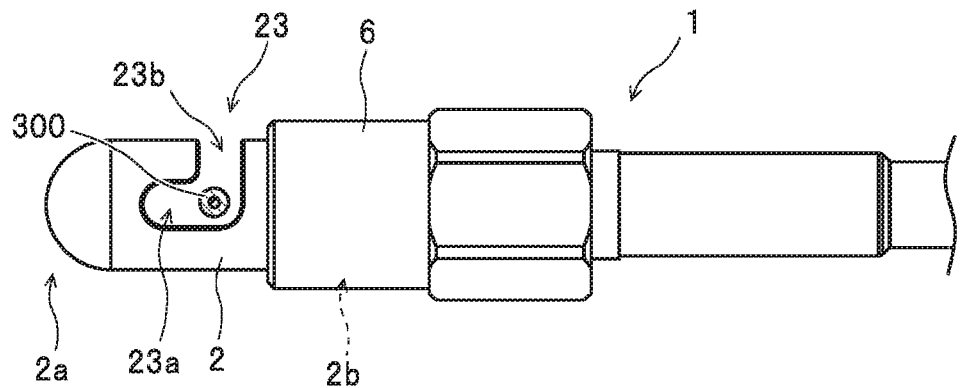
FIG. 7 is a first diagram useful in explaining a method of using the voltage sensor 1.

First, the voltage sensor 1 is attached to the wire 300. More specifically, as depicted in FIGS. 7 and 8, the wire 300 is inserted into the insertion channel 23 of the support 2 so that the wire 300 becomes supported by the support 2. Here, as one example, the cutaway 23b of the insertion channel 23 is positioned below the wire 300 and after this, as depicted in FIG. 7, the voltage sensor 1 is moved upward so that the wire 300 advances into the cutaway 23b of the insertion channel 23 to position the wire 300 in the center in the radial direction (the up-down direction in FIGS. 7 and 8) of the support 2. Next, as depicted in FIG. 8, the voltage sensor 1 is moved (that is, movement to the right in FIG. 8) to position the wire 300 at the front ends of the cutaways 23a of the insertion channel 23 (that is, at the front end 2a side of the support 2). By doing so, it is possible to easily insert the wire 300 into the insertion channel 23.

Figure 9:
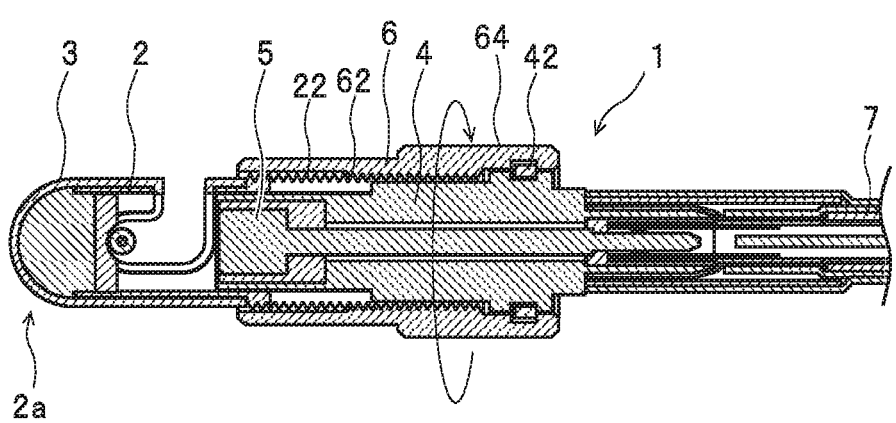
FIG. 9 is a third diagram useful in explaining a method of using the voltage sensor 1.

After this, as depicted in FIGS. 8 and 9, a screwing operation that rotates the threaded piece 6 clockwise to screw the female thread 62 of the threaded piece 6 onto the male thread 22 of the support 2 is performed. When doing so, by gripping the operator 64 of the threaded piece 6 with the fingertips, it is possible to easily and reliably perform the screwing operation with the fingertips prevented from slipping. Also, by gripping the operator 64 of the threaded piece 6 with a tool such as a spanner, it is possible to perform the screwing operation more reliably.

Due to the screwing operation, the shell 4 that is linked via the ring 42 to the threaded piece 6 and the detection electrode 5 that is supported on the shell 4 move together with the threaded piece 6 toward the front end 2a side of the support 2. Here, since the threaded piece 6 is constructed so as to be rotatable with respect to the shell 4, by performing a screwing operation while gripping the shielded cable 7 connected to the shell 4 so that the shell 4 does not rotate, it is possible to (linearly) move the shell 4 and the detection electrode 5 along the axis A direction toward the front end 2a side of the support 2 without the shell 4 and the detection electrode 5 rotating due to the screwing operation.

The voltage sensor 1 is also provided with the guide constructed of the slit 24 of the support 2 and the key 43 of the shell 4. This means that even when the operation of gripping the shielded cable 7 described above is not performed, it is still possible to reliably prevent rotation of the shell 4 and the detection electrode 5 with respect to the support 2 due to the screwing operation and to guide the shell 4 and the detection electrode 5 in the axis A direction.

Figure 10:
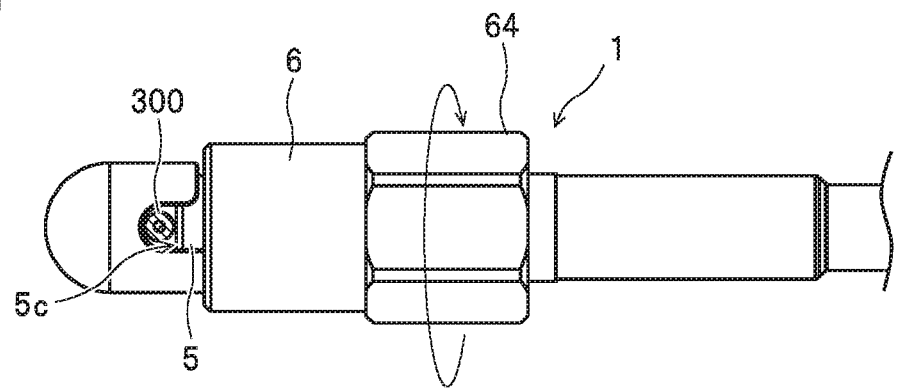
FIG. 10 is a fourth diagram useful in explaining a method of using the voltage sensor 1.
Figure 11:
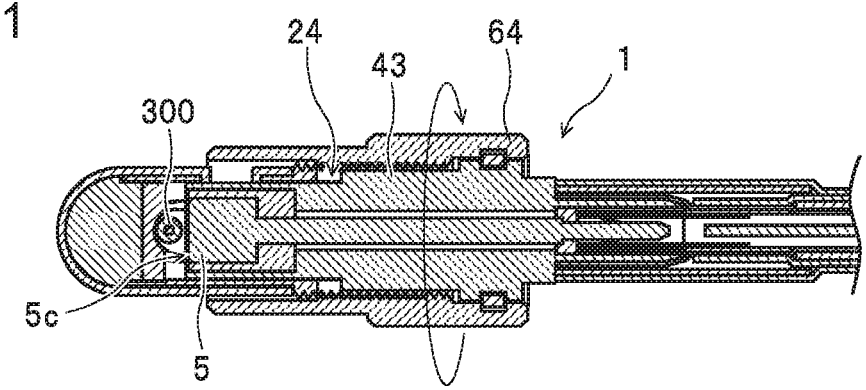
FIG. 11 is a fifth diagram useful in explaining a method of using the voltage sensor 1.

After this, by continuing the screwing operation further to move the shell 4, the detection electrode 5, and the threaded piece 6 further toward the front end 2a side of the support 2, the front end surface 5c of the detection electrode 5 is placed in contact with the wire 300 as depicted in FIGS. 10 and 11. In this case, as described above, the voltage sensor 1 is configured so that the shell 4 and the detection electrode 5 linearly move in the axis A direction without rotating due to the screwing operation. This means that with the voltage sensor 1, it is possible to reliably prevent damage to the wire 300 due to a force being applied to the wire 300 in a direction in which the detection electrode 5 is rotating (that is, a twisting direction).

Next, the female thread 62 is screwed further onto the male thread 22. At this time, the front end surface 5c of the detection electrode 5 is pressed onto the wire 300 so that the wire 300 becomes clamped between the edge of the insertion channel 23 of the support 2 and the front end surface 5c. With the voltage sensor 1, by performing a screwing operation that applies sufficient torque to the threaded piece 6, it is possible to reliably press the wire 300 with the front end surface 5c of the detection electrode 5. This means that with the voltage sensor 1, compared to a configuration that presses the front end surface 5c of the detection electrode 5 onto the wire 300 using only the biasing force of a coil spring, it is possible to achieve sufficiently tighter attachment between the front end surface 5c of the detection electrode 5 and the wire 300, and to reliably maintain this state. By doing so the voltage sensor 1 is attached to the wire 300.

Next, an operator, not illustrated, on the measuring apparatus body 50 of the measuring apparatus 500 is operated to start measurement. At this time, when a potential difference Vdi between the voltage V1 of the wire 300 and a voltage of a second reference potential G2 of the voltage detector 53 (that is, the voltages of the support 2 of the voltage sensor 1 and a shield body 51 that become the same potential as the second reference potential G2 via the braided shield 73 of the shielded cable 7, or in other words, the voltage of the voltage signal V4) has increased (for example, when the potential difference Vdi has increased due to an increase in the voltage V1), at the voltage detector 53 of the measuring apparatus body 50, the current value of the current signal I that flows from the wire 300 via the detection electrode 5 to the current-to-voltage converter circuit 53a increases. When this happens, the current-to-voltage converter circuit 53a lowers the voltage value of the detection voltage signal V2 being outputted. At the integrating circuit 53b, due to the drop in the detection voltage signal V2, the current flowing via the capacitor toward the inverting input terminal from the output terminal of the second operational amplifier increases. This means that the integrating circuit 53b boosts the voltage of the integrated signal V3. In keeping with the increase in voltage of the integrated voltage V3, the transistor of the drive circuit 53c enters a "deep on" state. By doing so, at the insulating circuit 53d (photocoupler), the current flowing in the light-emitting diode increases and the resistance of the phototransistor falls. Accordingly, the voltage value of the integrated signal V3a generated by dividing the potential difference (Vdd-Vss) using the resistance value of the resistor 54 and the resistance value of the phototransistor falls.

Also, at the measuring apparatus body 50, a voltage generator 55 raises the voltage value of the generated voltage signal V4 based on the integrated signal V3a. At the measuring apparatus 500, due to the current-to-voltage converting circuit 53a, the integrating circuit 53b, the drive circuit 53c, the insulating circuit 53d, and the voltage generating unit 55 constructing a feedback loop in this way carrying out a feedback control operation that detects the increase in the voltage V1 of the wire 300 and increases the voltage value of the voltage signal V4, the voltage of the second reference potential G2 of the voltage detector 53 or the like (that is, the voltage of the voltage signal V4) is caused to follow the voltage V1.

Also, when the potential difference Vdi has increased due to a drop in the voltage V1, the current value of the current signal I that flows out from the current-to-voltage converter circuit 53a to the wire 300 via the detection electrode 5 increases. At this time, due to the current-to-voltage converter circuit 53a and the like that construct a feedback loop executing a feedback control operation that is the opposite to the feedback control operation described above to lower the voltage of the voltage signal V4, the voltage of the second reference potential G2 and the like of the voltage detector 53 (that is, the voltage of the voltage signal V4) is caused to follow the voltage V1.

By doing so, with the measuring apparatus 500, by executing the feedback control operation that causes the voltage of the second reference potential G2 and the like of the voltage detector 53 (that is, the voltage of the voltage signal V4) to follow the voltage V1 in a short time, the voltage of the second reference potential G2 and the like of the voltage detector 53 (which, due to a virtual shorting of the first operational amplifier of the current-to-voltage converting circuit 53a, is also the voltage of the detection electrode 5) is matched to (that is, caused to converge with) the voltage V1. The voltmeter 56 measures the voltage value of the voltage signal V4 in real time and outputs the voltage data Dv that indicates such voltage value. After the voltage signal V4 has converged to the voltage V1 of the wire 300, due to the component elements that construct the feedback loop operating as described above, the voltage signal V4 follows the fluctuations in the voltage V1. Accordingly, the voltage data Dv indicating the voltage V1 of the wire 300 is continuously outputted from the voltmeter 56.

The processor 57 inputs the voltage data Dv outputted from the voltmeter 56 and stores the voltage data Dv in a memory. Next, the processor 57 executes the voltage calculating process to calculate the voltage V1 of the wire 300 based on the voltage data Dv and stores the voltage V1 in the memory. Finally, the processor 57 displays the measurement results (the voltage V1) stored in the memory on the display 58. By doing so, measurement of the voltage V1 of the wire 300 by the measuring apparatus 500 is completed.

Here, with the voltage sensor 1 of the measuring apparatus 500, as described above, by performing a screwing operation that applies sufficient torque to the threaded piece 6, the wire 300 can be reliably pressed by the front end surface 5c of the detection electrode 5, which makes it possible to reliably maintain a state where the attachment between the front end surface 5c of the detection electrode 5 and the wire 300 has been made sufficiently tighter. Accordingly, with the measuring apparatus 500, even if the wire 300 vibrates or an external force is applied to the voltage sensor 1, a situation where the capacitance value of an electrostatic capacitance CO (see FIG. 6) formed between the core wire 301 of the wire 300 and the front end surface 5c of the detection electrode 5, which is important when measuring the voltage V1 of the wire 300, greatly fluctuates is reliably avoided. As a result, with the measuring apparatus 500, it is possible to sufficiently improve detection accuracy for the voltage V1 compared to a configuration where the front end surface 5c of the detection electrode 5 is pressed against the wire 300 using only the biasing force of a coil spring.

Also, with the voltage sensor 1 of the measuring apparatus 500, the main body 10 (that is, the detection electrode 5 and the shell 4) and the shielded cable 7 are directly connected without using a connector. This means that with the voltage sensor 1, the strength of the connection between the main body 10 and the shielded cable 7 is sufficiently improved compared to a configuration where the main body 10 and the shielded cable 7 are connected using a connector, which sufficiently improves the resistance to vibration. Accordingly, with the measuring apparatus 500, even if the wire 300 vibrates and/or an external force is applied to the voltage sensor 1, it is possible to maintain the state where the main body 10 is reliably connected to the shielded cable 7 and to reliably detect the voltage V1 of the wire 300.

Next, the wire 300 is removed from the voltage sensor 1. In more detail, the threaded piece 6 is rotated anticlockwise and the shell 4, the detection electrode 5, and the threaded piece 6 are moved toward the base end 2b side of the support 2, thereby separating the front end surface 5c of the detection electrode 5 from the wire 300. After this, the voltage sensor 1 is moved so that the wire 300 comes out of the insertion channel 23. By performing the above operations, measurement of the voltage V1 supplied to the wire 300 ends.

In this way, according to the voltage sensor 1 and the measuring apparatus 500, by including the threaded piece 6 that has the female thread 62, which is screwed onto the male thread 22 formed on the outer circumferential surface 21a of the circumferential wall 21 of the support 2, formed on the inner circumferential surface 61a, that is externally attached to the shell 4 so as to be rotatable with respect to the shell 4, and that is capable of moving together with the shell 4 and the detection electrode 5 along the axis A direction of the support 2 due to a screwing operation, it is possible, by performing a screwing operation for example by gripping the shielded cable 7 connected to the shell 4 to prevent the shell 4 from rotating, to (linearly) move the shell 4 and the detection electrode 5 along the axis A direction toward the front end 2a side of the support 2 without the shell 4 and the detection electrode 5 rotating due to the screwing operation. This means that according to the voltage sensor 1 and the measuring apparatus 500, it is possible to reliably prevent a situation where the wire 300 is damaged due to a force being applied to the wire 300 in a direction of rotation of the detection electrode 5 (a twisting direction). Also, according to the voltage sensor 1 and the measuring apparatus 500, since it is possible to linearly move the shell 4 and the detection electrode 5 without the shell 4 and the detection electrode 5 rotating due to the screwing operation, it is possible to directly connect the detection electrode 5 and the shell 4 to the shielded cable 7 without using a connector to prevent twisting of the shielded cable 7 connected to the shell 4 and the detection electrode 5. This means that according to the voltage sensor 1 and the measuring apparatus 500, compared to a configuration where the main body 10 and the shielded cable 7 are connected using a connector, it is possible to sufficiently increase the connection strength between the main body 10 and the shielded cable 7 and to sufficiently improve the resistance to vibration. Therefore, according to the voltage sensor 1 and the measuring apparatus 500, even if the wire 300 vibrates and/or an external force is applied to the voltage sensor 1, it is possible to maintain the state where the main body 10 and the shielded cable 7 are reliably connected and to reliably detect the voltage V1 of the wire 300.

According to the voltage sensor 1 and the measuring apparatus 500, by providing the support 2 and the shell 4 with the guide (that is, the slit 24 and the key 43), that prevents rotation of the shell 4 with respect to the support 2 due to the screwing operation and guides the shell 4 in the axis A direction, even when an operation of gripping the shielded cable 7 is not performed, it is still possible to guide the shell 4 and the detection electrode 5 in the axis A direction and attach the voltage sensor 1 to the wire 300 while reliably preventing rotation of the shell 4 and the detection electrode 5 with respect to the support 2 due to the screwing operation. This means that according to the voltage sensor 1 and the measuring apparatus 500, it is possible to sufficiently improve operability when attaching the voltage sensor 1 to the wire 300.

Also, according to the voltage sensor 1 and the measuring apparatus 500, by using a configuration where the support 2, the shell 4, and the threaded piece 6 are conductive and become the same potential, it is possible to cause the support 2, the shell 4, and the threaded piece 6 to function as a shield. This means that it is possible to sufficiently reduce the influence of external disruptions on the detection electrode 5, and as a result, it is possible to further improve the detection accuracy for the voltage V1 of the wire 300.

Also, according to the voltage sensor 1 and the measuring apparatus 500, by constructing the insertion channel 23 of a pair of cutaways 23a, which are provided along the axis A direction at facing positions on the circumferential wall 21 of the support 2, and the cutaway 23b, which is provided in the circumferential wall 21 along a direction that is perpendicular to the axis A direction so as to join the base end 2b-side ends of the cutaways 23a, it is possible, for example by positioning the cutaway 23b below the wire 300 and moving the support 2 (the voltage sensor 1) upward and then moving the support 2 toward the base end 2b side, to easily position the wire 300 at a front end 2a-side ends of the support 2 inside the cutaways 23a. In this state, it is possible to reliably prevent the wire 300 from coming out of the insertion channel 23. This means that according to the voltage sensor 1 and the measuring apparatus 500, it is possible to easily and reliably support the wire 300 using the support 2.

Also, according to the voltage sensor 1 and the measuring apparatus 500, by providing the operator 64 for a screwing operation that has facing flat surfaces on the threaded piece 6 and gripping the flat surfaces of the operator 64 with the fingertips or a tool such as a spanner during a screwing operation, it is possible to reliably screw the female thread 62 onto the male thread 22. This means that according to the voltage sensor 1 and the measuring apparatus 500, it is possible to more reliably press the wire 300 with the front end surface 5c of the detection electrode 5, and as a result, it is possible to significantly improve the detection accuracy of the voltage V1.

Also, according to the voltage sensor 1 and the measuring apparatus 500, the connector 8 is constructed so as to include the socket 81 and the connector pipe 82 that are conductive. This means that according to the voltage sensor 1 and the measuring apparatus 500, by merely inserting the core wire 71 of the shielded cable 7 into one end of the socket 81 and inserting the base end 5b of the detection electrode 5 into the other end of the socket 81, it is possible to easily connect the detection electrode 5 and the core wire 71. Also, by attaching the connector pipe 82 to the periphery of the braided shield 73 of the shielded cable 7 that covers the shell 4 and crushing and crimping the connector pipe 82, it is possible to easily connect the shell 4 and the braided shield 73. This means that according to the voltage sensor 1 and the measuring apparatus 500, it is possible to sufficiently improve the efficiency of the task of connecting the shell 4 and the detection electrode 5 to the shielded cable 7.

Figure 13:
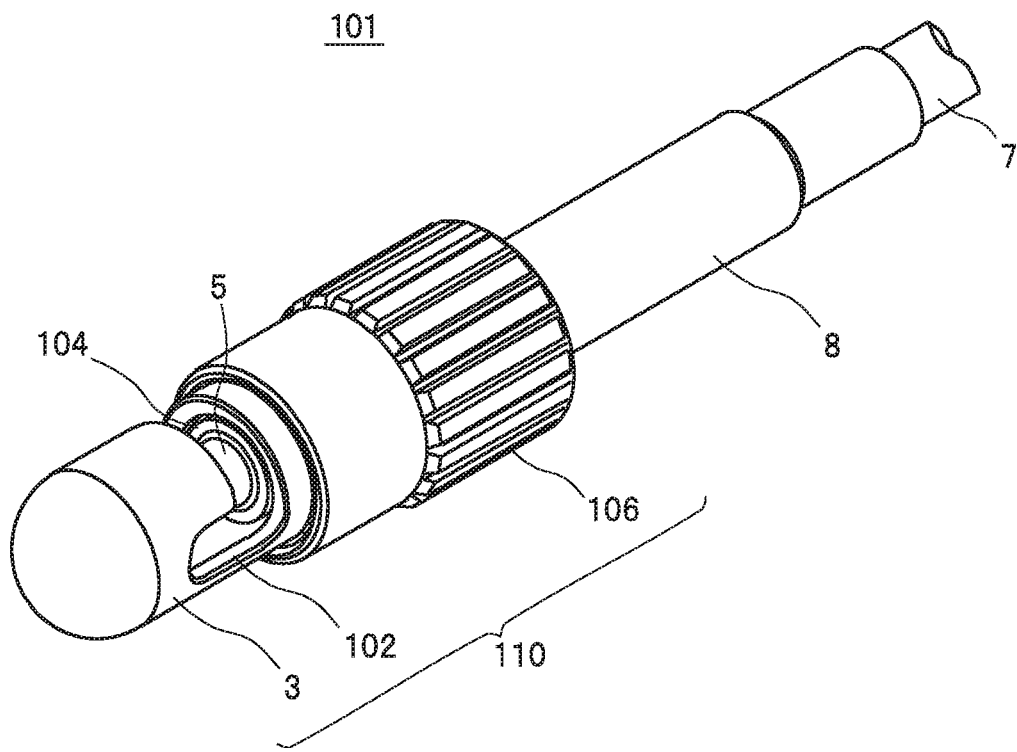
FIG. 13 is a perspective view of a voltage sensor 101.
Figure 14:
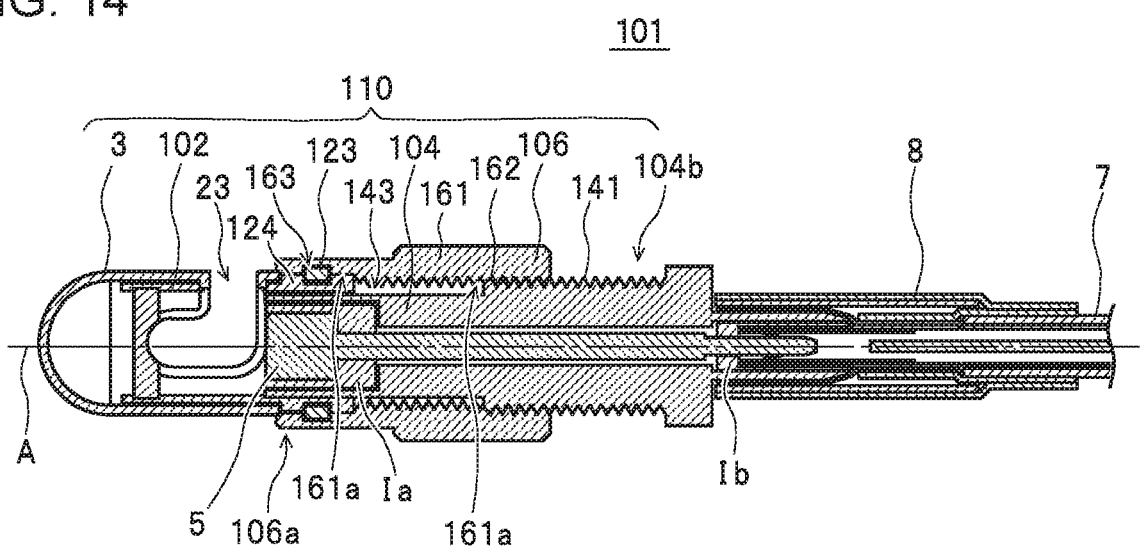
FIG. 14 is a cross-sectional view of a voltage sensor 101.
Figure 15:
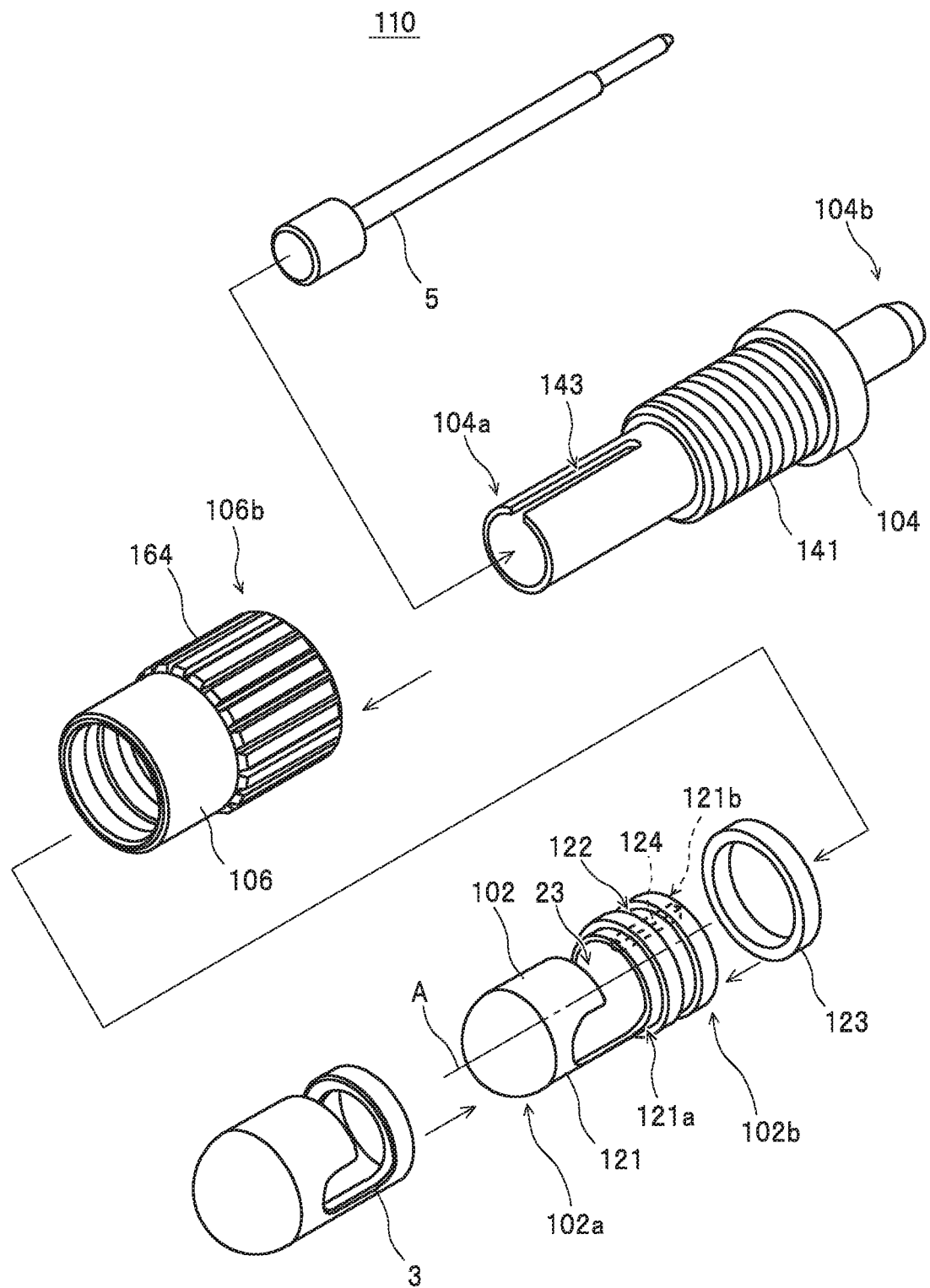
FIG. 15 is an exploded perspective view of a main body 110.

Next, a voltage sensor 101 depicted in FIG. 13 as another example of a "sensor" according to the present invention and a measuring apparatus 500 equipped with the voltage sensor 101 will be described. Note that in the following description, component elements that are the same as the voltage sensor 1 and the measuring apparatus 500 described above have been assigned the same reference numerals and duplicated description is omitted. As depicted in FIGS. 13 to 15, the voltage sensor 101 includes a support 102, the protective cap 3, a shell 104, the detection electrode 5, a threaded piece 106, the shielded cable 7, and the connector 8. Note that in the following description, a part of the voltage sensor 101 aside from the shielded cable 7 and the connector 8 is also referred to as a "main body 110".

As depicted in FIGS. 14 and 15, the support 102 has the insertion channel 23 and is constructed so as to be capable of supporting the wire 300. Also, as depicted in FIG. 15, a channel 122 is formed on an outer circumferential surface 121a of a circumferential wall 121 at a base end 102b side of the support 102 and a ring 123 is attached to the channel 122. A key 124 that extends along the axis A (see FIGS. 14 and 15) direction is formed in an inner circumferential surface 121b of the circumferential wall 121 at the base end 102b side. The support 102 is formed of a conductive material and is electrically connected via the threaded piece 106 to the shell 104 to keep the support 102 at the same potential as the shell 104. An insulating layer of an insulating material is formed by a coating process on the surface of the support 102.

As depicted in FIG. 15, the shell 104 is formed in the overall shape of a round tube (one example of a "tubular shape") and is constructed so as to be capable of supporting the detection electrode 5. As depicted in FIG. 15, the shell 104 is constructed so that a front end 104a side is capable of being inserted into the support 102 from the base end 102b side of the support 102. Also, as depicted in FIG. 14, a male thread 141 is formed on a base end 104b side of the shell 104. As depicted in FIG. 15, a slit 143 is also formed in a front end 104a of the shell 104. Together with the key 124 of the support 102, the slit 143 constructs a guide. In a state where the front end 104a side has been inserted into the support 102, the key 124 fits into the slit 143 and functions so as to guide the shell 104 in the axis A direction while preventing rotation of the shell 104 with respect to the support 102 due to a screwing operation, described later. The shell 104 is also formed of a conductive material, is connected via the braided shield 73 of the shielded cable 7, described later, to a referential potential of the measuring apparatus body 50, and functions as a shield that reduces the influence of external disruptions on the detection electrode 5.

As depicted in FIGS. 14 and 15, the threaded piece 106 is formed in the shape of a round tube (one example of a "tubular shape"). Also, as depicted in FIG. 14, a female thread 162 that screws onto the male thread 141 of the shell 104 is formed on an inner circumferential surface 161a of a circumferential wall 161 of the threaded piece 106. A channel 163 is also formed in the inner circumferential surface 161a at a front end 106a side of the threaded piece 106. With the voltage sensor 101, as depicted in FIGS. 14 and 15, by fitting the ring 123 attached to the support 102 into the channel 163 of the threaded piece 106, the threaded piece 106 is externally attached to the support 102 so as to be rotatable with respect to the support 102 (that is, the support 102 and the threaded piece 106 are rotatably linked via the ring 123). Also, with the voltage sensor 101, by performing a screwing operation that screws the female thread 162 of the threaded piece 106 onto the male thread 141 of the shell 104, it is possible to move the inserted shell 104 and the detection electrode 5 along the axis A direction.

Figure 18:
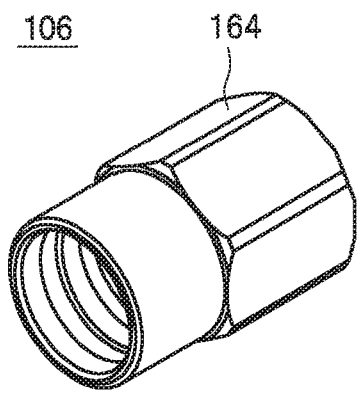
FIG. 18 is a perspective view depicting another configuration of a threaded piece 106.

Also, as depicted in FIG. 15, an operator 164 used during a screwing operation is provided on a base end 106b side of the threaded piece 106. Here, as one example, the operator 164 is subjected to flat eye knurling as an anti-slip treatment. Note that in place of the operator 164 being subjected to an anti-slip treatment, as depicted in FIG. 18, it is possible to use a base end 106b including an operator 164 that has three pairs of facing flat surfaces.

Figure 16:
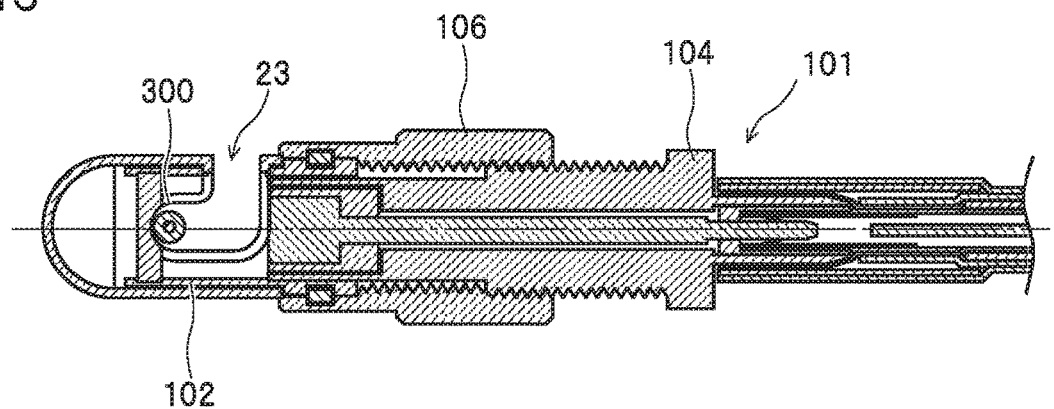
FIG. 16 is a first diagram useful in explaining a method of using the voltage sensor 101.
Figure 17:
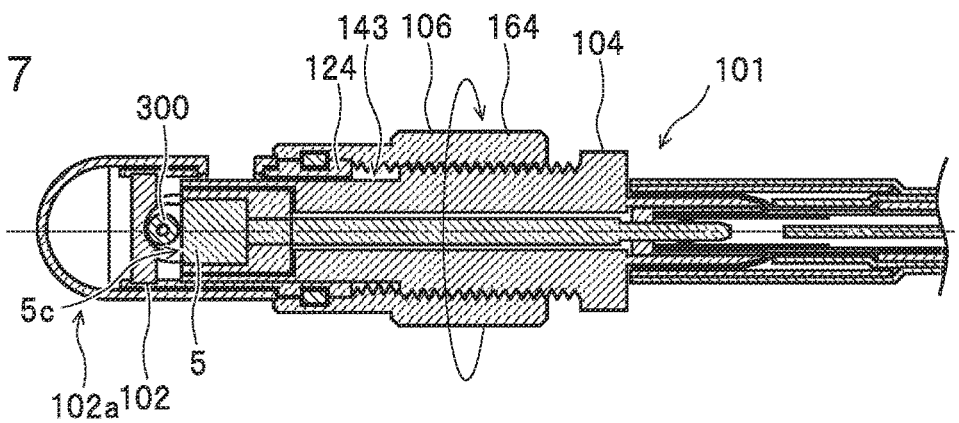
FIG. 17 is a second diagram useful in explaining a method of using the voltage sensor 101.

When the voltage sensor 101 is attached to the wire 300, as depicted in FIG. 16, the wire 300 is inserted into the insertion channel 23 of the support 102 so that the wire 300 is supported by the support 102. Next, as depicted in FIG. 17, a screwing operation that rotates the threaded piece 106 clockwise to screw the female thread 162 of the base end 106b onto the male thread 141 of the shell 104 is performed. When doing so, by gripping the operator 164 of the threaded piece 106 with the fingertips, it is possible to easily and reliably perform the screwing operation with the fingertips prevented from slipping.

Due to the screwing operation, the shell 104 and the detection electrode 5 supported by the shell 104 are moved toward a front end 102a side of the support 102. Here, since the threaded piece 106 is constructed so as to be rotatable with respect to the support 102, by performing the screwing operation while gripping the support 102, it is possible to prevent rotation of the support 102 due to the screwing operation and to (linearly) move the shell 104 and the detection electrode 5 along the axis A direction toward the front end 102a side of the support 102 without the shell 104 and the detection electrode 5 rotating with respect to the support 102 (that is, without the support 102 rotating with respect to the shell 104 and the detection electrode 5).

The voltage sensor 101 is also provided with the guide constructed of the key 124 of the support 102 and the slit 143 of shell 104. This means that it is possible to reliably prevent rotation of the shell 104 and the detection electrode 5 with respect to the support 102 (that is, rotation of the support 102 with respect to the shell 104 and the detection electrode 5) due to the screwing operation.

After this, by continuing the screwing operation further to move the shell 104 and the detection electrode 5 further toward the front end 102a side of the support 102, the front end surface 5c of the detection electrode 5 is placed in contact with the wire 300 as depicted in FIG. 17. Here, as described above, the voltage sensor 101 is configured so that the shell 104 and the detection electrode 5 linearly move in the axis A direction without the shell 104 and the detection electrode 5 rotating with respect to the support 102 due to the screwing operation. This means that with the voltage sensor 101 and the measuring apparatus 500, it is possible to reliably prevent damage to the wire 300 due to a force being applied to the wire 300 in a direction in which the detection electrode 5 is rotating (that is, a twisting direction).

Next, the female thread 162 is screwed further onto the male thread 141. By doing so, the voltage sensor 101 is attached to the wire 300. With the voltage sensor 101 and the measuring apparatus 500, by performing a screwing operation that applies sufficient torque to the threaded piece 106, it is possible to reliably press the wire 300 with the front end surface 5c of the detection electrode 5, to thereby make the attachment between the front end surface 5c of the detection electrode 5 and the wire 300 sufficiently tighter, and to reliably maintain this state.

According to the voltage sensor 101 and the measuring apparatus 500, since it is possible to linearly move the shell 104 and the detection electrode 5 without the shell 104 and the detection electrode 5 rotating with respect to the support 102 due to the screwing operation, it is possible to directly connect the main body 110 (that is, the shell 104 and the detection electrode 5) and the shielded cable 7 without using a connector to prevent twisting of the shielded cable 7. This means that according to the voltage sensor 101 and the measuring apparatus 500, compared to a configuration where the main body 110 and the shielded cable 7 are connected using a connector, it is possible to sufficiently increase the connection strength between the main body 110 and the shielded cable 7 and to sufficiently improve the resistance to vibration. Therefore, according to the voltage sensor 101 and the measuring apparatus 500, even if the wire 300 vibrates and/or an external force is applied to the voltage sensor 101, it is possible to maintain the state where the main body 10 is reliably connected to the shielded cable 7 and to reliably detect the voltage V1 of the wire 300.

Also, according to the voltage sensor 101 and the measuring apparatus 500, by providing the support 102 and the shell 104 with the guide (that is, the key 124 and the slit 143)

that prevents rotation of the shell 104 with respect to the support 102 due to the screwing operation and guides the shell 104 in the axis A direction, even when an operation of gripping the shielded cable 7 is not performed, it is still possible to guide the shell 104 and the detection electrode 5 in the axis A direction and attach the voltage sensor 101 to the wire 300 while reliably preventing rotation of the shell 104 and the detection electrode 5 with respect to the support 102 due to the screwing operation. This means that according to the voltage sensor 101 and the measuring apparatus 500 also, it is possible to sufficiently improve operability when attaching the voltage sensor 101 to the wire 300.

Also, according to the voltage sensor 101 and the measuring apparatus 500, by using a configuration where the support 102, the shell 104, and the threaded piece 106 are conductive and become the same potential, it is possible to cause the support 102, the shell 104, and the threaded piece 106 to function as a shield. This means that it is possible to sufficiently reduce the influence of external disruptions on the detection electrode 5, and as a result, it is possible to further improve the detection accuracy for the voltage V1 of the wire 300.

According to the voltage sensor 101 and the measuring apparatus 500, by constructing the insertion channel 23 of the pair of cutaways 23a, which are provided along the axis A direction at facing positions on the circumferential wall 121 of the support 102, and the cutaway 23b, which is provided on the circumferential wall 121 along a direction that is perpendicular to the axis A direction so as to join the base end 102b-side ends of the cutaways 23a, it is possible, for example by merely positioning the cutaway 23b below the wire 300, moving the support 102 (the voltage sensor 101) upward, and then moving the support 102 toward the base end 102b side, to easily position the wire 300 at a front end 102a-side ends of the support 102 inside the cutaways 23a. In this state, it is possible to reliably prevent the wire 300 from coming out of the insertion channel 23. This means that according to the voltage sensor 101 and the measuring apparatus 500, it is possible to reliably and easily support the wire 300 using the support 102.

Also, according to the voltage sensor 101 and the measuring apparatus 500, by providing the operator 164 for screwing operations with facing flat surfaces on the threaded piece 106 and gripping the flat surfaces of the operator 164 with the fingertips or a tool such as a spanner during a screwing operation, it is possible to reliably screw the female thread 162 onto the male thread 141. This means that according to the voltage sensor 101 and the measuring apparatus 500, it is possible to more reliably press the wire 300 with the front end surface 5c of the detection electrode 5, and as a result, it is possible to significantly improve the detection accuracy of the voltage V1.

Also, with the voltage sensor 101 and the measuring apparatus 500, the connector 8 is constructed of the socket 81 and the connector pipe 82 that are conductive. This means that according to the voltage sensor 101 and the measuring apparatus 500, by merely inserting the core wire 71 of the shielded cable 7 into one end of the socket 81 and inserting the base end 5b of the detection electrode 5 into the other end of the socket 81, it is possible to easily connect the detection electrode 5 and the core wire 71. Also, by attaching the connector pipe 82 to the periphery of the braided shield 73 of the shielded cable 7 that covers the shell 104 and crushing and crimping the connector pipe 82, it is possible to easily connect the shell 104 and the braided shield 73. This means that according to the voltage sensor 101 and the measuring apparatus 500, it is possible to sufficiently improve the efficiency of a task of connecting the shell 104 and the detection electrode 5 to the shielded cable 7.

Note that the sensor and the measuring apparatus according to the present invention are not limited to the configurations described above. As one example, the shape of the insertion channel 23 formed in the supports 2 and 102 is not limited to the shape described above, and can be arbitrarily changed.

Although examples that use the support 2 or 102, the shell 4 or 104, and the threaded piece 6 or 106 that are formed in round tubular shapes have been described above, the shapes of the support 2 or 102, the shell 4 or 104, and the threaded piece 6 or 106 are not limited to round tubes, and as examples, it is possible to use a configuration where the cross-sectional form is polygonal and a configuration where the cross-sectional form is oval.

Also, although examples where the present invention is adapted to voltage sensors 1 and 101 that detect the voltage V1 of the wire 300 (or "covered wire") as the detected value have been described above, it is possible to adapt the present invention to a sensor that detects a different detected value. As one example, the present invention can be adapted to a sensor (current sensor) where the support 2 or 102, the shell 4 or 104, the detection electrode 5, and the threaded piece 6 or 106 are formed of magnetic materials and the current flowing in the wire 300 (or "covered wire") is detected without metallic contact as the detected value.

Moreover, the invention encompasses any possible combination of some or all of the various embodiments and the modification examples described herein and incorporated herein.

It is possible to achieve at least the following configurations from the above-described example embodiments and the modification examples of the disclosure.

(1) A sensor capable of detecting a detected value for a covered wire without metallic contact, comprising:

a support that is formed in a tubular shape, has a male thread formed on an outer circumferential surface thereof, is provided with an insertion channel formed by cutting away part of a circumferential wall, and is capable of supporting the covered wire that has been inserted into the insertion channel;

a shell that is formed in a tubular shape and is capable of being inserted into the support from a base end side of the support;

a detection electrode that is formed in a pillar shape, is supported by the shell in a state where the detection electrode has been inserted inside the shell, and is inserted together with the shell into the support; and a threaded piece that is formed in a tubular shape, has a female thread that screws onto the male thread formed on an inner circumferential surface thereof, is externally attached to the shell so as to be rotatable with respect to the shell, and is capable of being moved along a direction of an axis, which joins the base end and a front end of the support, together with the shell and the detection electrode that have been inserted into the support by a screwing operation that screws the female thread onto the male thread, wherein the detection electrode is configured so that a front end surface thereof is capable of becoming capacitively coupled to a core wire of the covered wire via an insulating covering of the covered wire when the front end surface is pressed onto the covered wire that is supported on the support due to movement of the detection electrode toward a front end side of the support.

(2) A sensor capable of detecting a detected value for a covered wire without metallic contact, comprising:

a support that is formed in a tubular shape, is provided with an insertion channel formed by cutting away part of a circumferential wall, and is capable of supporting the covered wire that has been inserted into the insertion channel;

a shell that is formed in a tubular shape, has a male thread formed on an outer circumferential surface thereof, and is capable of being inserted into the support from a base end side of the support;

a detection electrode that is formed in a pillar shape, is supported by the shell in a state where the detection electrode has been inserted inside the shell, and is inserted together with the shell into the support; and a threaded piece that is formed in a tubular shape, has a female thread that screws onto the male thread formed on an inner circumferential surface thereof, is externally attached to the support so as to be rotatable with respect to the support, and moves the shell and the detection electrode, which have been inserted into the support, along a direction of an axis that joins the base end and a front end of the support by a screwing operation that screws the female thread onto the male thread, wherein the detection electrode is configured so that a front end surface thereof is capable of becoming capacitively coupled to a core wire of the covered wire via an insulating covering of the covered wire when the front end surface is pressed onto the covered wire that is supported on the support due to movement of the detection electrode toward a front end side of the support.

(3) The sensor according to any one of (1) and (2), wherein the support and the shell are provided with a guide that guides the shell in the direction of the axis and prevents rotation of the shell relative to the support due to the screwing operation.

(4) The sensor according to any one of (1) to (3), wherein the support, the shell, and the threaded piece are conductive and configured so as to become a same potential, and the detection electrode is supported by the shell so as to be insulated from the shell.

(5) The sensor according to any one of (1) to (4), wherein the insertion channel includes:

a pair of first cutaways provided along the direction of the axis at facing positions on the circumferential wall at an intermediate position between the front end and the base end of the support; and a second cutaway that is provided in the circumferential wall along a direction perpendicular to the direction of the axis so as to join base end-side ends of the first cutaways.

(6) The sensor according to any one of (1) to (5), wherein the threaded piece includes an operator for the screwing operation that has facing flat surfaces.

(7) The sensor according to any one of (1) to (6), further comprising a shielded cable and a connector that connects a core wire of the shielded cable and the detection electrode and also connects a shield conductor of the shielded cable and the shell, wherein the connector includes a socket and a connector pipe that are conductive, the socket is capable of connecting a front end of the core wire of the shielded cable and the base end of the detection electrode, which have been inserted from respective end sides of the socket, and the connector pipe is capable of connecting the shell and the shield conductor by being crimped in a state where the shield conductor has been disposed on the outer circumferential surface of the shell and inserted in the connector pipe.

(8) A measuring apparatus comprising:

the sensor according to any one of (1) to (7);

a measuring apparatus body connected to the sensor;

a voltage detector that is disposed inside the measuring apparatus body, detects a voltage of the covered wire as the detected value via the detection electrode, and outputs a voltage signal that changes in keeping with the voltage;

a voltage generator that is disposed inside the measuring apparatus body and generates a voltage that follows the voltage of the covered wire based on the voltage signal; and a processor that is disposed inside the measuring apparatus body and measures the voltage of the covered wire based on the voltage generated by the voltage generator, wherein the voltage detector operates on a floating voltage that has a potential of the voltage generated by the voltage generator as a reference.

What is claimed is:

1. A sensor capable of detecting a detected value for a covered wire without metallic contact, comprising:

a support that is formed in a tabular shape, has a male thread formed on an outer circumferential surface thereof, is provided with an insertion channel formed by cutting away part of a circumferential wall, and is capable of supporting the covered wire that has been inserted into the insertion channel;

a shell that is formed in a tubular shape and is capable of being inserted into the support from a base end side of the support;

a detection electrode that is formed in a pillar shape, is supported by the shell in a state where the detection electrode has been inserted inside the shell, and is inserted together with the shell into the support; and a threaded piece that is formed in a tubular shape, has a female thread that screws onto the male thread formed on an inner circumferential surface thereof, is externally attached to the shell so as to be rotatable with respect to the shell, and is capable of being moved along a direction of an axis, which joins the base end and a front end of the support, together with the shell and the detection electrodes that have been inserted into the support by a screwing operation that screws the female thread onto the male thread, wherein the detection electrode is configured so that a front end surface thereof is capable of becoming capacitively coupled to a core wire of the covered wire of an uncovered wire via an insulating covering of the covered wire when the front end surface is pressed onto the covered wire that is supported on the support due to movement of the detection electrode toward a front end side of the support.

2. A sensor capable of detecting a detected value for a covered wire without metallic contact, comprising:

a support that is formed in a tubular shape, is provided with an insertion channel formed by cutting away part of a circumferential wall, and is capable of supporting the covered wire that has been inserted into the insertion channel;

a shell that is formed in a tubular shape, has a male thread formed on an outer circumferential surface thereof, and is capable of being inserted into the support from a base end side of the support;

a detection electrode that is formed in a pillar shape, is supported by the shell in a state where the detection electrode has been inserted inside the shell, and is inserted together with the shell into the support; and a threaded piece that is formed in a tubular shape, has a female thread that screws onto the male thread formed on an inner circumferential surface thereof, is externally attached to the support so as to be rotatable with respect to the support, and moves the shell and the detection electrode, which have been inserted into the support, along a direction of an axis that joins the base end and a front end of the support by a screwing operation that screws the female thread onto the male thread, wherein the detection electrode is configured so that a front end surface thereof is capable of becoming capacitively coupled to a core wire of the covered wire via an insulating covering of the covered wire when the front end surface is pressed onto the covered wire that is supported on the support due to movement of the detection electrode toward a front end side of the support.

3. The sensor according to claim 1,
wherein the support and the shell are provided with a guide that guides the shell in the direction of the axis and prevents rotation of the shell relative to the support due to the screwing operation.

4. The sensor according to claim 2,
wherein the support and the shell are provided with a guide that guides the shell in the direction of the axis and prevents rotation of the shell relative to the support due to the screwing operation.

5. The sensor according to claim 1,
wherein the support, the shell, and the threaded piece are conductive and configured so as to become a same potential, and
the detection electrode is supported by the shell so as to be insulated from the shell.

6. The sensor according to claim 2,
wherein the support, the shell, and the threaded piece are conductive and configured so as to become a same potential, and
the detection electrode is supported by the shell so as to be insulated from the shell.

7. The sensor according to claim 1,
wherein the insertion channel includes:
a pair of first cutaways provided along the direction of the axis at facing positions on the circumferential wall at an intermediate position between the front end and the base end of the support; and
a second cutaway that is provided in the circumferential wall along a direction perpendicular to the direction of the axis so as to join base end-side ends of the first cutaways.

8. The sensor according to claim 2,
wherein the insertion channel includes:
a pair of first cutaways provided along the direction of the axis at facing positions on the circumferential wall at an intermediate position between the front end and the base end of the support; and
a second cutaway that is provided in the circumferential wall along a direction perpendicular to the direction of the axis so as to join base end-side ends of the first cutaways.

9. The sensor according to claim 1,
wherein the threaded piece includes an operator for the screwing operation that has facing flat surfaces.

10. The sensor according to claim 2,
wherein the threaded piece includes an operator for the screwing operation that has facing flat surfaces.

11. The sensor according to claim 1,
further comprising a shielded cable and a connector that connects a core wire of the shielded cable and the detection electrode and also connects a shield conductor of the shielded cable and the shell,
wherein the connector includes a socket and a connector pipe that are conductive,
the socket is capable of connecting a front end of the core wire of the shielded cable and the base end of the detection electrode, which have been inserted from respective end sides of the socket, and
the connector pipe is capable of connecting the shell and the shield conductor by being crimped in a state where the shield conductor has been disposed on the outer circumferential surface of the shell and inserted in the connector pipe.

12. The sensor according to claim 2,
further comprising a shielded cable and a connector that connects a core wire of the shielded cable and the detection electrode and also connects a shield conductor of the shielded cable and the shell,
wherein the connector includes a socket and a connector pipe that are conductive,
the socket is capable of connecting a front end of the core wire of the shielded cable and the base end of the detection electrode, which have been inserted from respective end sides of the socket, and
the connector pipe is capable of connecting the shell and the shield conductor by being crimped in a state where the shield conductor has been disposed on the outer circumferential surface of the shell and inserted in the connector pipe.

13. A measuring apparatus comprising:
the sensor according to claim 1;
a measuring apparatus body connected to the sensor;
a voltage detector that is disposed inside the measuring apparatus body, detects a voltage of the covered wire as the detected value via the detection electrode, and outputs a voltage signal that changes in keeping with the voltage;
a voltage generator that is disposed inside the measuring apparatus body and generates a voltage that follows the voltage of the covered wire based on the voltage signal; and
a processor that is disposed inside the measuring apparatus body and measures the voltage of the covered wire based on the voltage generated by the voltage generator,
wherein the voltage detector operates on a floating voltage that has a potential of the voltage generated by the voltage generator as a reference.

14. A measuring apparatus comprising:
the sensor according to claim 2;
a measuring apparatus body connected to the sensor;
a voltage detector that is disposed inside the measuring apparatus body, detects a voltage of the covered wire as the detected value via the detection electrode, and outputs a voltage signal that changes in keeping with the voltage;
a voltage generator that is disposed inside the measuring apparatus body and generates a voltage that follows the voltage of the covered wire based on the voltage signal; and
a processor that is disposed inside the measuring apparatus body and measures the voltage of the covered wire based on the voltage generated by the voltage generator, wherein the voltage detector operates on a floating voltage that has a potential of the voltage generated by the voltage generator as a reference.

* * * * *